(12) United States Patent
Kono et al.

(10) Patent No.: US 6,337,824 B1
(45) Date of Patent: Jan. 8, 2002

(54) DYNAMIC SEMICONDUCTOR MEMORY DEVICE WITH REDUCED CURRENT CONSUMPTION IN SENSING OPERATION

(75) Inventors: Takashi Kono; Takeshi Hamamoto, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/455,541

(22) Filed: Dec. 7, 1999

(30) Foreign Application Priority Data

Jun. 8, 1999 (JP) ............................. 11-160853

(51) Int. Cl.[7] .............................................. G11C 7/02
(52) U.S. Cl. ........................................ 365/207; 365/205
(58) Field of Search ................................. 365/207, 208, 365/205, 230.03, 63, 51, 203

(56) References Cited

U.S. PATENT DOCUMENTS 4,980,799 A * 12/1990 Tobita ......................... 361/311
5,030,859 A * 7/1991 Ihara ............................ 307/530
5,446,697 A * 8/1995 Yoo et al. ..................... 365/226
5,687,123 A 11/1997 Hidaka et al. ............. 365/189.09

FOREIGN PATENT DOCUMENTS

JP         6-215571        8/1994

* cited by examiner

Primary Examiner—Richard Elms
Assistant Examiner—Hien Nguyen
(74) Attorney, Agent, or Firm—McDermott, Will & Emery

(57) ABSTRACT

A decoupling capacitor is coupled to a sense power supply line with respect to a sense amplifier circuit group, and the sense power supply line is selectively coupled with a power supply node in response to an operation mode of a sense amplifier. In a sensing operation, the potential of a bit line is determined by redistribution of charges between the decoupling capacitor and a load capacitor of the bit line. Refresh characteristics is improved without increasing a sense current and showing down the sensing operation.

19 Claims, 17 Drawing Sheets

CONVENTIONAL BSG SCHEME

INVENTIVE BSG SCHEME

FIG. 7A
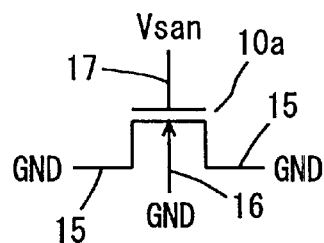
FIG. 7B
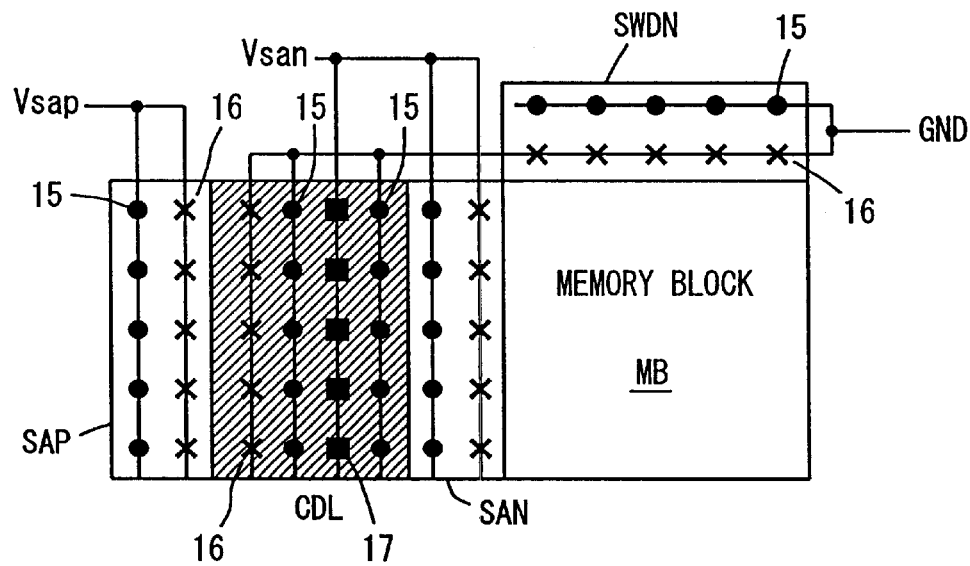
FIG. 7C         FIG. 7D         FIG. 7E
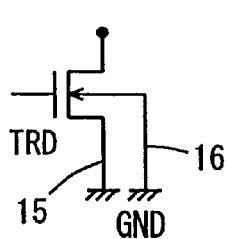  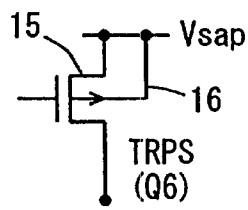  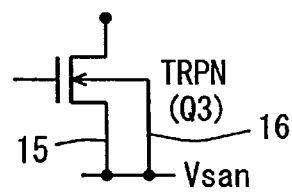

DYNAMIC SEMICONDUCTOR MEMORY DEVICE WITH REDUCED CURRENT CONSUMPTION IN SENSING OPERATION

BACKGROUND OF THE INVENTION

1. Field of the Invention

The present invention relates to a semiconductor memory device, and more particularly, it relates to a dynamic semiconductor memory device having a sense amplifier differentially amplifying memory cell data. More specifically, the present invention relates to the structure of a drive part for the sense amplifier.

2. Description of the Background Art

Following the recent development and spread of computers and information processing terminals, requirement for devices employed as main storage in these equipments is increasingly severe. With respect to a DRAM (dynamic random access memory) most widely utilized as the main storage, a DRAM capable of transferring data at a high speed such as an SDRAM (synchronous DRAM) inputting/outputting data in synchronization with a clock signal or a DDR (double data rate) SDRAM inputting/outputting data in synchronization with both leading and trailing edges of a clock signal is now in the process of popularization.

The DRAM stores information in a capacitor of a memory cell in the form of charges. High-level data written in a DRAM cell is spontaneously disappears due to a leakage current when left intact, and must be periodically restored through an operation referred to as refresh.

The specification for a recent DRAM defines an operation referred to as self-refresh. In such a self-refresh operation mode, a timer in the DRAM automatically sets a refresh timing for automatically performing the refresh operation.

The self-refresh operation is performed in a standby state when no access is made to DRAM. Therefore, a continuous wait time in a portable communication information terminal, for example, can be increased by suppressing a self-refresh current consumed in the self-refresh operation (since the life time of a battery can be prolonged).

Among components of the self-refresh current, what accounts for the largest percentage is a current for reading data stored in a memory cell and rewriting the data, i.e., the so-called sense current Issr. This sense current is now described.

FIG. 27 illustrates the structure of a memory cell array of a conventional DRAM. Referring to FIG. 27, the DRAM includes memory cells MC arranged in a matrix of rows and columns, a pair of bit lines BL and /BL arranged in correspondence to each column of the memory cells and a word line WL arranged in correspondence to each row of the memory cells MC. FIG. 27 representatively shows a single memory cell MC. Memory cell MC includes a memory cell capacitor Cs for storing information and an access transistor MT formed by an n-channel MOS transistor and rendered conductive in response to the signal voltage on word line WL for connecting the memory cell capacitor Cs with bit line BL. Bit lines BL and /BL have parasitic capacitances Cb respectively.

A bit line equalize/precharge circuit E/P precharging and equalizing the bit lines BL and /BL to an intermediate voltage Vble in response to a bit line equalization instruction signal BLEQ and a sense amplifier circuit S/A differentially amplifying the voltages of bit lines BL and /BL in response to sense amplifier activation signals SON and ZSOP are provided for bit lines BL and /BL.

Bit line equalize/precharge circuit E/P includes precharge transistors Q7 and Q8 transmitting the intermediate voltage Vble to bit lines BL and /BL respectively in response to bit line equalization instruction signal BLEQ and an equalize transistor Q9 shorting the bit lines BL and /BL in response to bit line equalization instruction signal BLEQ. The transistors Q7 to Q9 are formed by n-channel MOS transistors (insulated gate field effect transistors).

Sense amplifier circuit S/A includes an N sense amplifier activated in activation of the sense amplifier activation signal SON for discharging one of bit lines BL and /BL at a lower potential and a P sense amplifier activated in activation of the sense amplifier activation signal ZSOP for charging one of bit lines BL and /BL at a higher potential. N sense amplifier includes an n-channel MOS transistor Q1 having a drain connected to bit line BL and a gate connected to bit line /BL, an n-channel MOS transistor Q2 having a drain connected to bit line /BL and a gate connected to bit line BL and an n-channel MOS transistor Q3 rendered conductive in activation of sense amplifier activation signal SON for transmitting a sense power supply voltage Vsan to sources of the MOS transistors Q1 and Q2. The sense power supply voltage Vsan is generally at the level of a ground voltage Vsg.

P sense amplifier includes a p-channel MOS transistor Q4 having a drain connected to bit line BL and a gate connected to bit line /BL, a p-channel MOS transistor Q5 having a drain connected to bit line /BL and a gate connected to bit line BL and a p-channel MOS transistor Q6 rendered conductive in activation of sense amplifier activation signal ZSOP for transmitting a sense power supply voltage Vsap to sources of the MOS transistors Q4 and Q5. Sense power supply voltage Vsap is generally at the level of a power supply voltage Vdds. A refresh operation for memory cell MC will be now described with reference to a signal waveform diagram shown in FIG. 28.

In a standby state, sense amplifier activation signal SON is low at the ground voltage Vss, sense amplifier activation signal ZSOP is inactive at the power supply voltage Vdds, and sense amplifier circuit S/A is inactive. Bit line equalization instruction signal BLEQ is in a high-level active state, and all MOS transistors Q7 to Q9 included in bit line equalize/precharge circuit E/P are rendered conductive so that bit lines BL and /BL are precharged and equalized to the level of intermediate voltage Vble. The intermediate voltage Vble is generally at a level of half the power supply voltage Vdds (=Vdds/2). Word line WL is at the level of ground voltage Vsg, and access transistor MT of memory cell MC remains non-conductive.

When a memory cycle is started, bit line equalization instruction signal BLEQ falls to a low level, bit line equalize/precharge circuit E/P is inactivated and bit lines BL and /BL enter electrically floating states at the level of intermediate voltage Vble.

Then, a row selection circuit (not shown) drives the word line WL to a selected state in accordance with an address signal, and the voltage level of word line WL increases. When the voltage level of word line WL exceeds the gate-to-source voltage of access transistor MT by a level corresponding to the threshold voltage of the access transistor, access transistor MT starts conducting, and electric charges move between bit line BL and memory capacitor Cs. Referring to FIG. 28, the memory cell MC stores high-level data and the voltage level of bit line BL increases.

Bit line /BL connected with no memory cell remains at the level of intermediate voltage Vble.

When the voltage difference between bit lines BL and /BL is sufficiently enlarged, sense amplifier activation signals SON and ZSOP are activated. When sense amplifier activation signal SON is activated to go high, MOS transistor Q3 is rendered conductive in sense amplifier circuit S/A to transmit the sense power supply voltage Vsan to the sources of MOS transistors Q1 and Q2. Responsively, N sense amplifier is activated and bit line /BL at a lower potential is discharged to the level of sense power supply voltage Vsan (=Vsg). When sense amplifier activation signal ZSOP is activated to go low, MOS transistor Q6 is rendered conductive in sense amplifier circuit S/A to transmit the sense power supply voltage Vsap to the sources of MOS transistors Q4 and Q5, and P sense amplifier is activated. P sense amplifier charges the bit line BL at a higher potential to sense power supply voltage Vsap (=Vdds).

Word line WL is at the level of a voltage Vpp higher than power supply voltage Vdds. Therefore, the high-level data at the level of power supply voltage Vdds on bit line BL is transmitted to memory cell capacitor Cs with no influence by threshold voltage loss across access transistor MT. Thus, the high-level data is completely rewritten and refreshed in memory cell MC. If memory cell MC stores low-level data, a voltage at the level of sense power supply voltage Vsan is transmitted to memory cell capacitor Cs for similarly refreshing the data.

When the refresh cycle is completed, word line WL is driven to a non-selected state and then sense amplifier activation signals SON and ZSOP are sequentially inactivated. Thus, the refreshed data is stored in memory cell MC. Then, bit line equalization instruction signal BLEQ goes high, bit line equalize/precharge circuit E/P is activated, and the bit line voltages at the levels of power supply voltage Vdds and ground voltage Vsg are precharged and equalized to the level of intermediate voltage Vble.

The maximum amplitude dVbl of bit line BL is given as Vdds−Vble=Vdds/2. Bit line BL is charged by charges supplied from a sense power source. Assuming that Cb represents the bit line load and N represents the number of simultaneously refreshed pairs of bit lines, the quantity Qs of charges consumed in a single refresh operation is expressed as follows:

$$Qs = N \cdot Cb \cdot dVbl$$

Assuming that Tref represents the period of the refresh operation, i.e., the refresh interval, the sense current Issr flowing in the self-refresh operation is expressed as follows:

$$Issr = Qs/Tref \qquad (1)$$
$$= A \cdot dVbl/Tref$$
where $A = N \cdot Cb$

In order to reduce the sense current Issr, the refresh interval Tref must be increased and the bit line amplitude dVbl must be reduced.

In order to increase the refresh interval Tref, it is important to implement a memory cell having a long data holding time. In order to implement such a memory cell, contrivance on circuit and layout is required in addition to improvement of characteristics on manufacturing process.

In order to reduce the bit line amplitude dVbl (=Vdds/2), the power supply voltage Vdds is generally reduced.

FIG. 29 illustrates an exemplary structure of a conventional sense power supply circuit. Referring to FIG. 29, the conventional sense power supply circuit includes a compare circuit CMP comparing a reference voltage Vrefs with a sense power supply voltage Vsap (=Vdds) and a drive transistor DR supplying a current to a sense power supply line from an external power supply node receiving an external power supply voltage ext. Vdd in accordance with an output signal of compare circuit CMP. Drive transistor DR is formed by a p-channel MOS transistor.

Compare circuit CMP includes n-channel MOS transistors Q10 and Q11 receiving the reference voltage Vrefs and the sense power supply voltage Vsap in respective gates, p-channel MOS transistors Q12 and Q13 supplying currents to MOS transistors Q10 and Q11 from the external power supply node, and an n-channel MOS transistor Q14 coupled between MOS transistors Q10 and Q11 and a ground node and rendered conductive in activation of a control signal VDCON for forming a path flowing an operating current for compare circuit CMP.

P-channel MOS transistor Q13 has a gate and a drain interconnected with each other as well as a gate connected to a gate of MOS transistor Q12. MOS transistors Q12 and Q13 form a current mirror circuit. An output signal of compare circuit CMP is output from a connection node between MOS transistors Q12 and Q10 and supplied to the gate of drive transistor DR.

The control signal VDCON is activated in activation of a sense amplifier circuit.

In the structure of the sense power supply circuit shown in FIG. 29, when the control signal VDCON is low, MOS transistor Q14 is rendered non-conductive, the output signal of compare circuit CMP is at the level of external power supply voltage ext. Vdd, drive transistor DR is rendered non-conductive, and current consumption in the sense power supply circuit is reduced.

When control signal VDCON is activated, compare circuit CMP compares the reference voltage Vrefs with the sense power supply voltage Vsap. When sense power supply voltage Vsap is higher than reference voltage Vrefs, the output signal of compare circuit CMP goes high, drive transistor DR remains non-conductive, and supply of a current to a sense power supply line is stopped.

When sense power supply voltage Vsap is reduced below the reference voltage Vrefs, the output signal of compare circuit CMP goes low in proportion to the difference between sense power supply voltage Vsap and reference voltage Vrefs, the conductance of drive transistor DR is increased, and a current is supplied to the sense power supply line from the external power supply node. Thus, the level of sense power supply voltage Vsap is increased.

The sense power supply circuit shown in FIG. 29 holds the sense power supply voltage Vsap substantially at the same level as the reference voltage Vrefs. The reference voltage Vrefs is held at a constant level lower than external power supply voltage ext. Vdd, thereby reducing the level of sense power supply voltage Vsap, so that the bit line amplitude dVbl as well as the charging current can be responsively reduced.

The sense power supply voltage Vsap determines the level of high-level data written in a memory cell. If the level of reference voltage Vrefs is reduced and responsively the level (Vdds) of sense power supply voltage Vsap is reduced, the quantity of charges stored in a memory cell capacitor is reduced and the data hold time is reduced for high-level data written in the memory cell. Therefore, the refresh interval Tref must be set short in order to hold the memory cell data, and there is a possibility that the sense current Issr is not reduced as a whole.

In order to solve the aforementioned problem, Asakura et al. has proposed a BSG (boosted sense ground) scheme.

While the contents of the BSG scheme are described in detail in ISSCC Digest of Technical Papers 1994, pp. 1303 to 1309, for example, the principle of the BSG scheme is now briefly described with reference to FIG. 30.

FIG. 30 schematically illustrates the sectional structure of a memory cell MC. Referring to FIG. 30, memory cell MC includes high-concentration N-type impurity regions 502a and 502b formed spacedly on the surface of a P-type substrate 500, a conductive layer 504 formed on a channel region between the impurity regions 502a and 502b with a gate insulation film 503 underlaid, and an interlayer isolation film 505b. Conductive layer 504 forms a word line WL, and the conductive layer 505a forms a bit line BL.

Memory cell MC further includes a conductive layer 510 electrically connected with impurity region 502b through a contact hole formed in interlayer isolation film 505b and a conductive layer 514 arranged facing to the upper part of conductive layer 510. Conductive layer 514 has a V-shaped upper shape in sectional structure, and conductive layer 514 includes a projecting part 514 extending into the V-shaped portion on the upper region of conductive layer 510 through a capacitor insulation film 512. Conductive layer 510 serves as a conduction node between an access transistor MT and a memory cell capacitor Cs, i.e., a storage node SN. Memory cell capacitor Cs is formed on a region where conductive layers 510 and 514 face to each other through capacitor insulation film 512.

While memory cell MC has a stacked capacitor structure in FIG. 30, the stacked capacitor may have any other structure such as a cylindrical or fin structure or a T-shaped sectional structure.

Consider that word line WL is held at the level of a ground voltage GND, a bit line voltage Vbl is applied to bit line BL and a voltage Vch corresponding to high-level data is held in storage node SN in memory cell MC shown in FIG. 30. An intermediate voltage of a cell plate voltage Vcp (=Vdds/2) is applied to conductive layer 514 serving as a cell plate electrode layer CP.

Main leakage sources in memory cell MC are (1) a leakage current Ils to P-type substrate 500 through a p-n junction between impurity region 502b and the substrate 500 and (2) a leakage current Ilb toward bit line BL dependent on the subthreshold characteristic of the access transistor.

The level of the leakage current Ils to P-type substrate 500 so depends on a potential difference Vpn applied to the p-n junction between impurity region 502b and P-type substrate 500 that the leakage current Ils increases as the potential difference Vpn increases. Referring to FIG. 30, storage node SN is at the voltage Vch corresponding to high-level data and a bias voltage Vbb is applied to P-type substrate 500, and hence the potential difference Vpn is expressed as follows:

$$Vpn=Vch-Vbb$$

On the other hand, the leakage current Ilb flowing to bit line BL through the access transistor is expressed by the difference between a gate-to-source voltage Vgs and a threshold voltage Vth of the access transistor as follows:

$$Ilb=Ilb0\cdot 10\wedge(Vgs-Vth)/S \qquad (2)$$

where $\wedge$ represents an exponentiation. In the above equation (2), Ilb0 represents a current value defining the threshold voltage Vth, and S represents a coefficient decided according to the transistor structure and the manufacturing process and is expressed as dVgs/dlogId, where Id represents a drain current.

In the equation (2), it appears that the leakage current Ilb is not dependent on the potential Vbl of bit line BL connected with the access transistor. However, the threshold voltage Vth is dependent on the substrate-to-source voltage Vbs=Vbb−Vbl, where Vbb is non-positive, and reduces as the bit line voltage, or the source voltage Vbl reduces, i.e., the absolute value of the substrate-to-source voltage Vbs reduces.

When the bit line BL corresponding to a memory cell connected to a non-selected word line in a memory block to be refreshed swings in potential to low-level data (the bit line voltage Vbl is equal to ground voltage GND in the prior art), for example, the absolute value of the substrate-to-source voltage Vbs of the access transistor in the memory cell reduces, and the bit line leakage current Ilb increases even if the word line WL is at the level of ground voltage GND. As understood from the above equation (2), the bit line leakage current Ilb deviates by about 10 times if the threshold voltage Vth slightly changes by 0.1 V since an S factor is generally 0.1 V.

In order to suppress the aforementioned bit line leakage current, the bias voltage Vbb to P-type substrate 500 can be set negative as shown in FIG. 31A. Upon setting the substrate bias voltage Vbb deep in the negative direction, the bit line leakage current Ilb is suppressed. However, the potential difference applied across the p-n junction between impurity region 502b and P-type substrate 500 increases on the contrary, to increase the substrate leakage current Ils. Power supply voltage Vdds determines the level of the voltage Vch corresponding to high-level data of storage node SN, and when the substrate leakage current Ils increases due to the deep substrate bias voltage in the negative direction, it is difficult to hold the high-level data over a long period if the power supply voltage is lowered. On the other hand, the BSG scheme provides the following advantages:

(a) As shown in FIG. 31B, a back gate bias voltage is set at the level of the ground voltage GND while a positive voltage Vbsg is applied to the bit line BL (/BL). The word line WL is at the level of ground voltage GND in a non-selected state. Therefore, the gate-to-source voltage Vgs of access transistor MT is at a negative level −Vbsg. Ground voltage GND is applied to P-type substrate 500, and hence the potential difference Vpn applied across the p-n junction between impurity region 502b and P-type substrate 500 in the storage node is equal to the voltage Vch of the high-level data. Thus, the potential difference applied across the p-n junction can be reduced.

In other words, the gate-to-source voltage Vgs of access transistor MT can be rendered negative, the voltage Vbs applied across the p-n junction between source impurity region 502a of access transistor and P substrate 500 attains a reverse biasing state, and the bit line leakage current Ilb can be reduced without applying a negative voltage to P substrate 500.

(b) The potential difference Vpn applied across the p-n junction in storage node SN is reduced and the substrate leakage current Ils can be reduced.

(c) The precharge voltage Vble for the bit line BL must be half the bit line amplitude, and is Vdds/2+Vbsg/2. In sensing operation, the voltage level on bit line BL or /BL is sensed from the precharge voltage Vble to power supply voltage Vdds or to the voltage Vdsg, and hence the bit line amplitude dVbl can be reduced by Vbsg/2 and current consumption can be reduced.

The destruction rate of the high-level data is relaxed due to the aforementioned items (a) and (b) and hence the refresh interval Tref can responsively be made long. In other words, the power supply voltage Vdds can be lowered if the same refresh interval Tref is allowed. In this case, therefore, the bit line amplitude dVbl can be reduced by the above item (c), and the sense current Issr can be remarkably reduced in accordance with the above equation (1).

As described above, the BSG scheme has excellent advantages of reduction of the sense current and improvement of the refreshability. The bias voltage Vbb applied to the substrate region, i.e., the back gate of the access transistor is at the level of ground voltage GND, and no negative bias voltage need be applied and the circuit structure is simplified. However, the low-level voltage of the bit line BL is higher than the ground voltage GND by about 0.5 V. A bit line precharged to the intermediate voltage level must be discharged to be held at the level of the voltage Vbsg, and a circuit generating the bit line boosted source ground voltage Vbsg must have large current drivability (a large number of bit lines are simultaneously discharged and hence the bit line discharge current must be absorbed). Therefore, when utilizing diode-connected p-channel MOS transistors is utilized, for example, variation of threshold voltages or temperature dependency of the diode-connected transistors becomes a negligible factor and it is difficult to stably generate the bit line boosted source ground voltage Vbsg in a dc manner.

Immediately after sense amplifier circuit S/A is activated to start a sensing operation, charges abruptly flow into a sense low-level power supply line (Vbsg level) from the bit line having been precharged at level of intermediate voltage ((Vdds+Vbsg)/2) to raise the level of the voltage Vbsg transiently. When the level of the boosted source ground voltage Vbsg remarkably increases, the gate-to-source voltage of the n-channel MOS transistors (Q1 and Q2) included in N sense amplifier of sense amplifier circuit S/A reduces and the n-channel MOS transistors of the N sense amplifier enter OFF states, the bit line cannot be discharged and hence there is a possibility that the sensing operation remarkably is slowed down. In order to suppress such transient fluctuation of the boosted source ground voltage Vbsg, therefore, a circuit generating the boosted source ground voltage Vbsg must have extremely high current drivability and ability for stably holding the voltage level.

In addition, as another way to stabilize the boosted source ground voltage Vbsg, a stabilizing capacitor having a sufficiently large capacitance value should be connected to the sense low-level power supply line. When an NMOS capacitor employing an n-channel MOS transistor is utilized for minimizing the occupying area, however, the threshold voltage Vthn of the MOS transistor is substantially equal to the boosted source ground voltage Vbsg, and there is a possibility that a sufficient inversion layer is not formed in a channel region of the MOS capacitor, and the MOS capacitor becomes instable, and it may be impossible to implement a reliable stabilizing capacitor.

As shown in FIG. 32A, a ground voltage utilized for generating the boosted source ground voltage Vbsg and ground voltage GND applied to the P substrate as a bias voltage are of different systems. Thus, noise generated in the P substrate is prevented from exerting bad influence on boosted source ground voltage Vbsg.

In this case, however, the ground voltage GND applied to the P substrate as a bias voltage and the boosted source ground voltage Vbsg may fluctuate in different phases and amplitudes due to a noise, as shown in FIG. 32B. When the voltages Vbsg and GND change in the same phase and amplitude, conditions Vbs<0 and Vgs<0 simultaneously hold in the access transistor and increase of the bit line leakage current is suppressed.

If the noise of the P substrate and that of the boosted source ground voltage Vbsg are different in amplitude or phase from each other, however, the level of the bias voltage GND for the P substrate exceeds the boosted source ground voltage Vbsg in the worst case. In this case, the voltages Vbs and Vgs take positive values, the gate-to-source voltage Vgs of the access transistor reaches a positive level, the bit line leakage current Ilb abruptly increases and the refresh characteristic of the memory cell remarkably deteriorates.

While the aforementioned advantage of the BSG scheme in the above item (c), i.e., reduction of the bit line amplitude brings another advantage of reduction of the sense current, a problem may arise in terms of the sensing speed.

Consider that a read voltage ΔV is transmitted to the bit line BL as shown in FIG. 33. In this state, the sense power supply voltages Vbsg and Vdds are supplied to sense amplifier circuit S/A. The gate-to-source voltages Vgs of MOS transistors Q1 and Q2 are substantially about (Vdds−Vbsg)/2 (read voltage ΔV is neglected), and the gate-to-source voltages Vgs of MOS transistors Q4 and Q5 are also about (Vdds−Vbsg)/2. In this case, therefore, the gate-to-source voltages Vgs of MOS transistors Q1, Q2, Q4 and Q5 are substantially equal to the bit line amplitude dVbl. If the bit line amplitude dVbl reduces, therefore, the absolute values of the gate-to-source voltages Vgs of the MOS transistors included in sense amplifier circuit S/A reduce to reduce the ability of charging/discharging the bit lines BL and /BL. In this case, therefore, the timing at which the voltage levels of bit lines BL and /BL are made definite may be retarded to reduce the sensing speed.

The sensing operation itself remains identical between in a self-refresh operation and a normal operation mode for accessing data. If the sensing speed is slowed down due to reduction of the bit line amplitude, therefore, the sensing speed in the normal operation mode is also reduced, the timing for column selection must be retarded, and there is a possibility that the access time is increased in response.

SUMMARY OF THE INVENTION

An object of the present invention is to provide a semiconductor memory device which can be improved in refresh characteristics without increasing current consumption.

Another object of the present invention is to provide a semiconductor memory device which can stably supply a write voltage of a desired level to a bit line.

Still another object of the present invention is to provide a semiconductor memory device which can stably supply a sense power supply voltage of a desired level to a sense amplifier circuit.

A further object of the present invention is to provide an improved semiconductor memory device of a BSG scheme which can be improved in refresh characteristics without reducing a sensing speed.

Briefly stated, the semiconductor memory device according to the present invention includes a decoupling capacitor provided to a sense power supply line for stably generating a voltage written in a refresh memory cell, and generates the write voltage by capacitance division with a load capacitance of the sense amplifier circuit.

A sensing operation is basically an operation of charging/discharging a capacitive load determined by the capacitance of a memory cell and parasitic capacitances of a pair of bit lines. Therefore, stable voltage levels can be generated on the pair of bit lines by charge transfer by means of a capacitive element for enabling a stable sensing operation and preventing slow-down of the sensing operation. The voltage level of a bit line is determined by capacitance division of the capacitive element and a load of the bit line, and hence the bit line can be simply held at a desired voltage level for preventing deterioration of refresh characteristics.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7A illustrates the structure of a capacitive element employed in the second embodiment of the present invention, FIG. 7B illustrates arrangement of the capacitive elements in the second embodiment of the present invention, FIG. 7C illustrates connection of a sub word line drive transistor shown in FIG. 7B, FIG. 7D illustrates connection of a P sense amplifier transistor shown in FIG. 7B, and FIG. 7E illustrates connection of an N sense amplifier transistor shown in FIG. 7B;

DESCRIPTION OF THE PREFERRED EMBODIMENTS

[First Embodiment]

Figure 1:
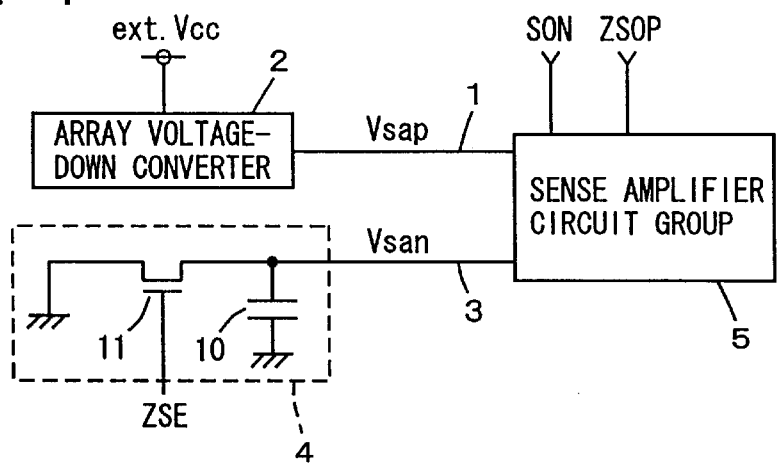
FIG. 1 schematically illustrates the structure of a main part of a semiconductor memory device according to a first embodiment of the present invention.

FIG. 1 illustrates the structure of a main part of a semiconductor memory device according to a first embodiment of the present invention. Referring to FIG. 1, the semiconductor memory device includes an array voltage-down converter 2 for down-converting an external power supply voltage ext. Vcc to generate a P sense power supply voltage Vsap (=Vdds) on a sense power supply line 1, and an N sense power supply circuit 4 generating an N sense power supply voltage Vsan having a dynamically changing level on an N sense power supply line 3 in accordance with a sense activation signal ZSE. The sense power supply voltages Vsap and Vsan on the sense power supply lines 1 and 3 are supplied in common to sense amplifier circuits included in a sense amplifier circuit group 5. The sense amplifier circuits included in the sense amplifier circuit group 5 are activated in response to sense amplifier activation signals SON and ZSOP. The sense amplifier activation signals SON and ZSOP are activated in response to inactivation of the sense activation signal ZSE.

N sense power supply circuit 4 includes a decoupling capacitor 10 coupled between N sense power supply line 3 and a ground node, and a switching transistor 11 rendered conductive in inactivation of the sense activation signal ZSE for connecting the N sense power supply line 3 to ground node. Decoupling capacitor 10 has a sufficiently large capacitance value and has both electrodes thereof connected to the ground node when sense activation signal ZSE is inactivated (high level). When sense activation signal ZSE is active, switching transistor 11 is rendered non-conductive and the sense power supply voltage Vsan on N sense power supply line 3 changes to a voltage level determined by the capacitance value of decoupling capacitor 10 and that of a load capacitance driven by a sense amplifier. Decoupling capacitor 10 is charged by a discharging current from sense amplifier circuit group 5 and hence the voltage level of N sense power supply voltage Vsan increases to rendering a voltage level corresponding to low-level data on a bit line higher than the ground voltage level.

Figure 29:
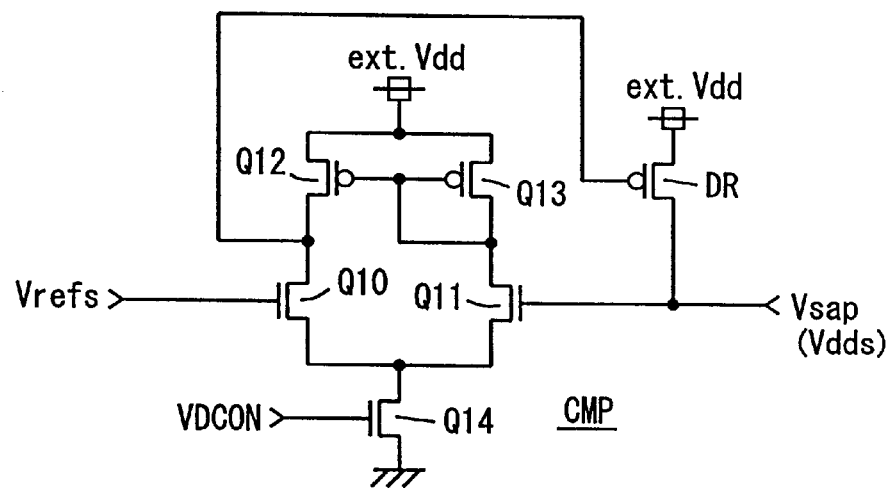
FIG. 29 illustrates the structure of a conventional array voltage-down converting circuit.
Figure 30:
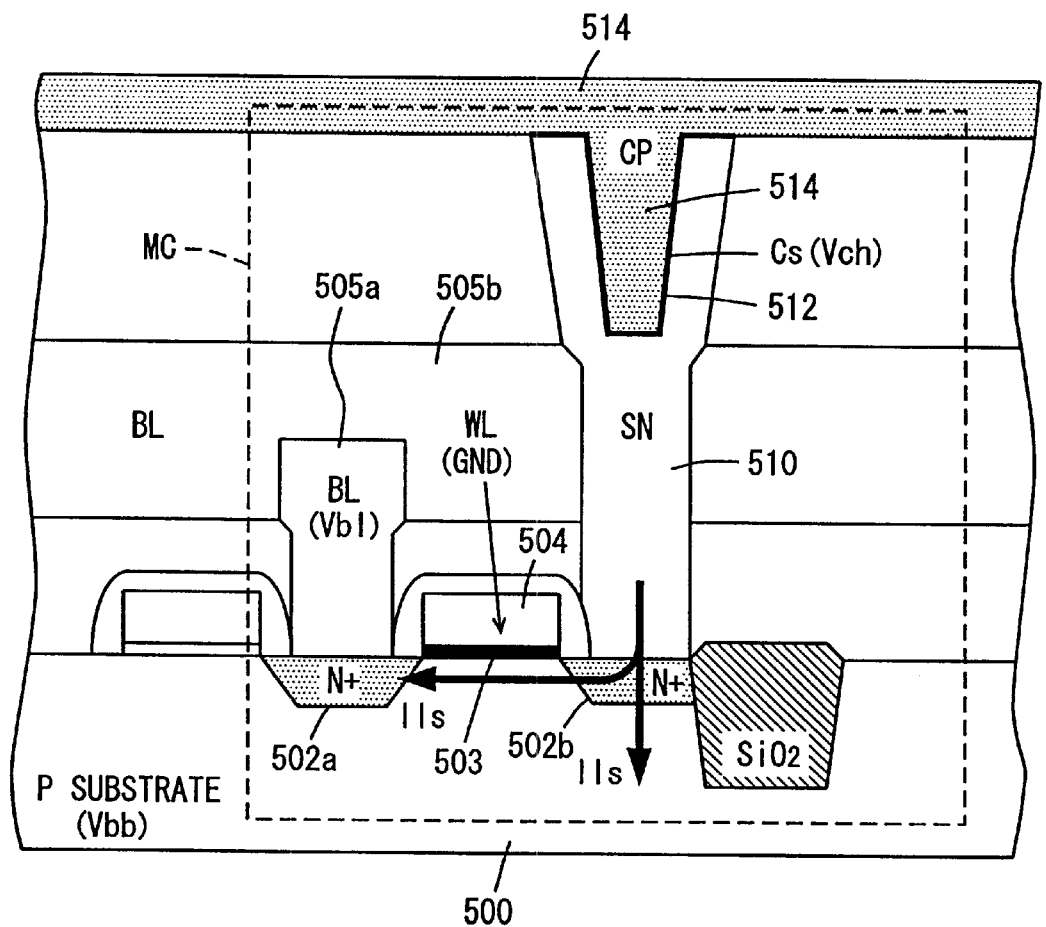
FIG. 30 schematically illustrates a sectional structure of a memory cell of the conventional semiconductor memory device.
Figure 31A:
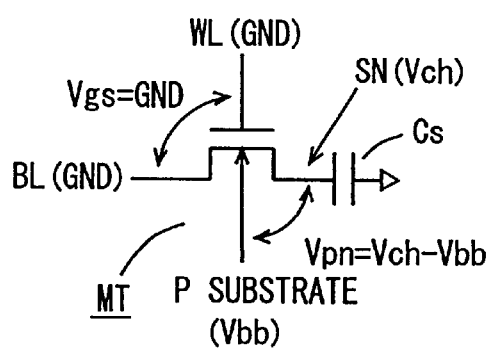
FIG. 31A schematically illustrates a voltage applied to the memory cell of the conventional semiconductor memory device.
Figure 31B:
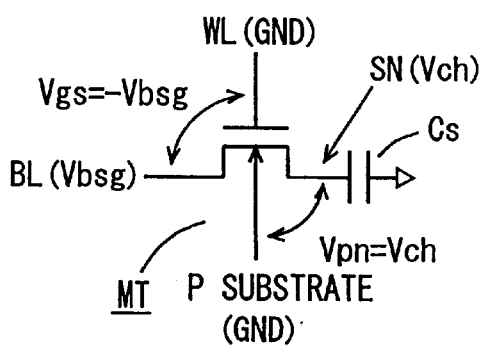
FIG. 31B illustrates a voltage applied to a memory cell of a conventional BSG scheme.
Figure 32A:
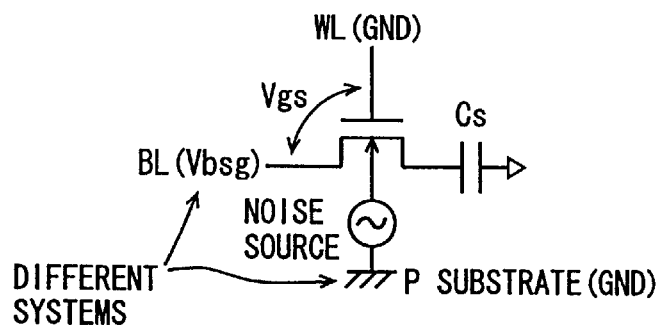
FIG. 32A schematically illustrates power supply arrangement of the conventional BSG scheme.
Figure 32B:
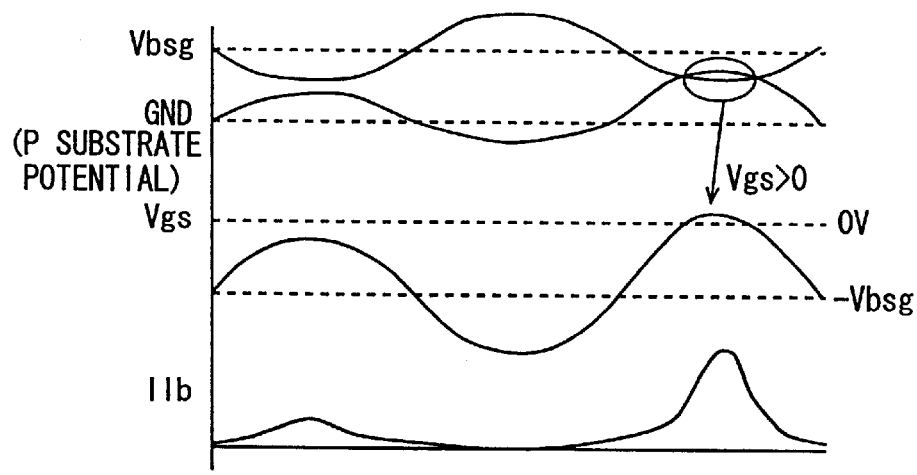
FIG. 32B is a signal waveform diagram for illustrating a problem of the power supply arrangement shown in FIG. 32A.
Figure 33:
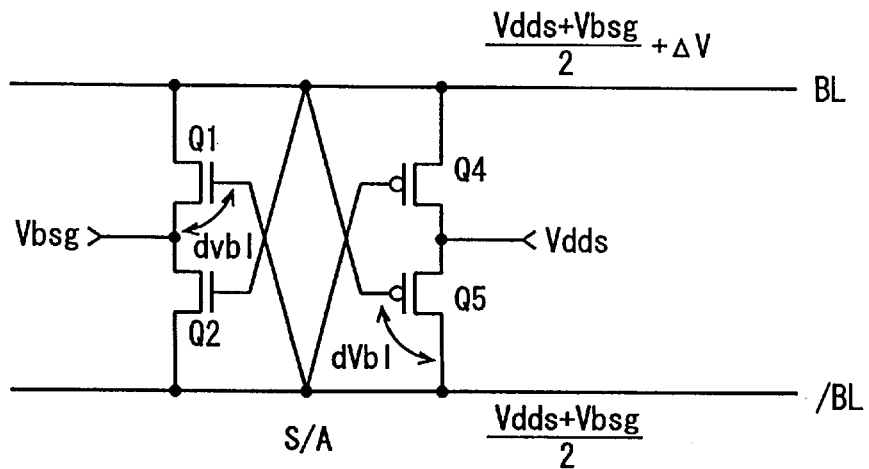
FIG. 33 illustrates a voltage applied immediately after a sensing operation of a conventional sense amplifier circuit of the BSG scheme.

Array voltage-down converter 2 has a structure similar to that of the internal voltage-down converter shown in FIG. 29, and supplies a current from an external power supply node in accordance with a result of comparison of a reference voltage (not shown) and P sense power supply voltage Vsap, and maintains the P sense power supply voltage Vsap at a prescribed level.

Figure 2:
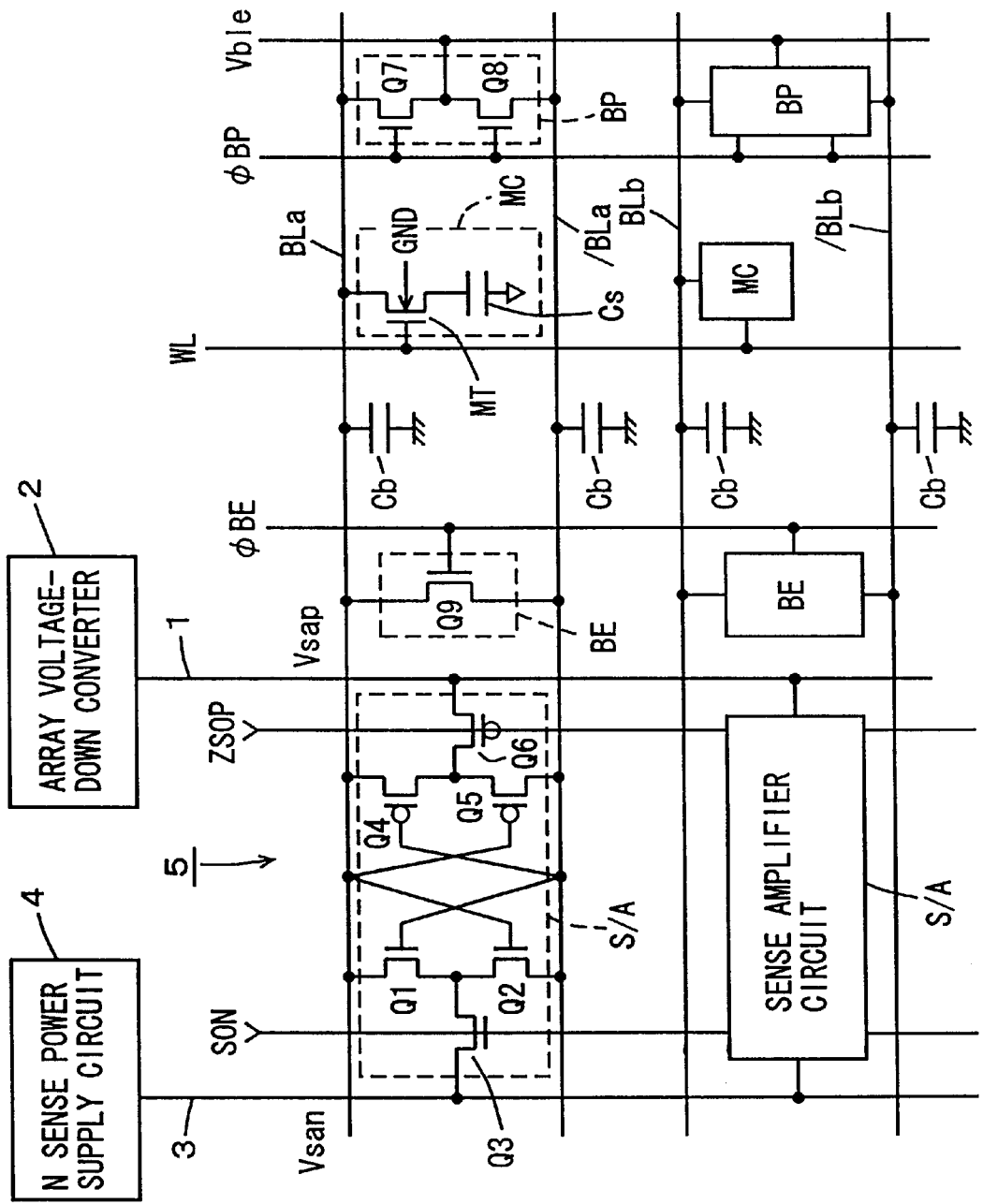
FIG. 2 illustrates the structure of an array part of the semiconductor memory device according to the first embodiment of the present invention.

FIG. 2 illustrates the structure of an array part of the semiconductor memory device according to the first embodiment of the present invention. FIG. 2 representatively shows pairs of bit lines BLa and /BLa and BLb and /BLb, and a word line WL. Memory cells MC are arranged in correspondence to intersections of the word line WL and the bit lines BLa and BLb. Each of memory cells MC includes a memory cell capacitor Cs and an access transistor MT, similarly to the prior art. A ground voltage GND is applied to a back gate (substrate region) of access transistor MT as a substrate bias voltage Vbb.

A bit line equalize circuit BE shorting the bit lines BLa and /BLa in response to an equalization instruction signal φBE and a precharge circuit BP transmitting an intermediate voltage Vble to bit lines BLa and /BLa in accordance with a precharge instruction signal φBP are provided for the pair of bit lines BLa and /BLa. Bit line equalize circuit BE includes an n-channel MOS transistor Q9 receiving the equalization instruction signal φBE in its gate. Bit line precharge circuit BP includes n-channel MOS transistors Q7 and Q8 rendered conductive in response to precharge instruction signal φBP for transmitting the precharge voltage Vble to bit lines BLa and /BLa, respectively.

A sense amplifier circuit S/A is provided for bit lines BLa and /BLa. The sense amplifier circuit S/A includes an N sense amplifier formed by n-channel transistors Q1 and Q2 having gates and drains cross-coupled, a P sense amplifier formed by p-channel MOS transistors Q4 and Q5 having gates and drains cross-coupled, an n-channel MOS transistor Q3 rendered conductive in response to sense amplifier activation signal SON for coupling the N sense power supply line 3 to a source node between MOS transistors Q1 and Q2, and a p-channel MOS transistor Q6 transmitting the P sense power supply voltage Vsap on P sense power supply line 1 to a source node between MOS transistors Q4 and Q5 in response to activation of sense amplifier activation signal ZSOP.

Bit line equalize circuit BE, bit line precharge circuit BP and sense amplifier circuit S/A are provided also for the pair of bit lines BLb and /BLb. N sense power supply voltage Vsan supplied onto N sense power supply line 3 from the N sense power supply circuit 4 is supplied in common to the sense amplifier circuits S/A, and P sense power supply voltage Vsap from the array voltage-down converter 2 is also supplied in common to the sense amplifier circuits S/A.

In the structure shown in FIG. 2, MOS transistors Q3 and Q6 for activating the sense amplifiers are provided in correspondence to each sense amplifier circuit S/A. Alternatively, MOS transistors Q3 and Q6 for activating the sense amplifiers may be shared by a plurality of sense amplifier circuits S/A. In other words, a single MOS transistor Q3 and a single MOS transistor Q6 may be provided for a prescribed number of sense amplifier circuits S/A. The pairs of bit lines BLa and /BLa and BLb and /BLb have parasitic capacitances (bit line loads) Cb respectively. Operations of the structure shown in FIG. 2 are now described.

Figure 3:
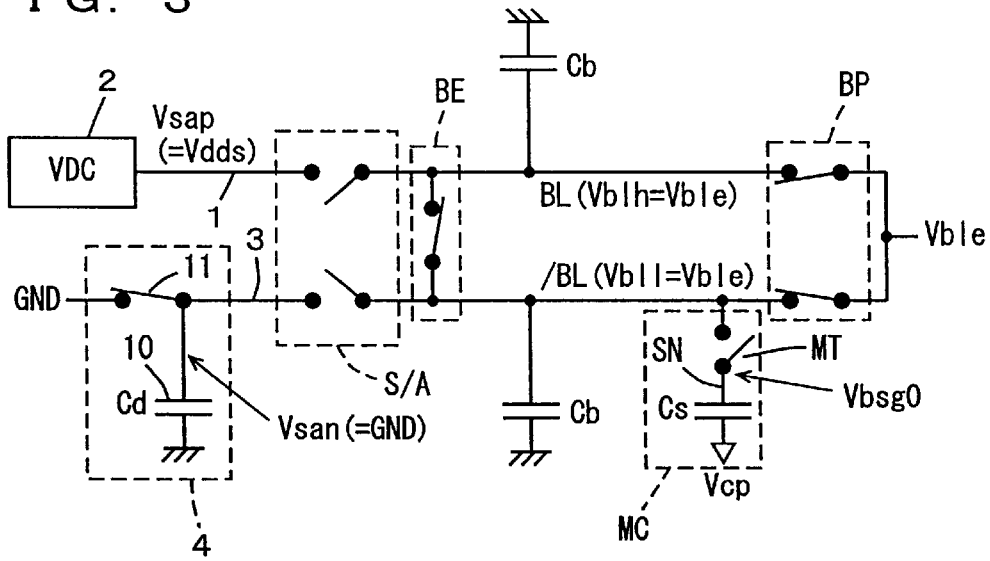
FIG. 3 conceptually illustrates a state of the semiconductor memory device according to the first embodiment of the present invention in a precharge period.

FIG. 3 conceptually illustrates states of the respective circuits in a precharge period (standby state) of the semiconductor memory device according to the first embodiment of the present invention. FIG. 3 shows each switching transistor as a mechanical switch. In the precharge period, all transistors (Q7 to Q9) included in bit line precharge circuit BP and the bit line equalize circuit BE are conductive, and bit lines BL and /BL are held at the level of an intermediate voltage Vble. Equalize circuit BE is rendered conductive for shorting the bit lines BL and /BL made definite to high and low levels by a sensing operation in a previous cycle, thereby generating the intermediate voltage Vble. Intermediate voltage Vble is equal to (Vdds+Vbsg)/2. In order to stably hold the bit line precharge voltage even when the precharge period is long, the intermediate voltage Vble is supplied to the bit lines BL and /BL through bit line precharge circuit BP. In memory cell MC, the access transistor is non-conductive and a storage node SN is disconnected from bit line /BL. Storage node SN stores low-level data (voltage Vbsg0).

Sense amplifier circuit S/A is inactive, i.e., the transistors (Q3 and Q6) for activating the sense amplifiers are non-conductive, and sense power supply lines 1 and 3 are disconnected from bit lines BL and /BL. An equalize circuit (not shown) equalizes the source nodes in sense amplifier circuit S/A to the intermediate voltage level in the structure shown in FIG. 2, and not only the transistors for activating the sense amplifiers but also the MOS transistors Q1, Q2, Q4 and Q5 for the sensing operation are non-conductive during the precharge period. The array voltage-down converter (VDC) 2 operates also during the precharge period, and supplies the P sense power supply voltage Vsap of a constant level. A voltage-down converter 2 may include both of a regularly operating standby array voltage-down converter and an active voltage-down converter having high current drivability and operating only when the sensing operation is performed.

In N sense power supply circuit 4, switching transistor 11 is conductive and decoupling capacitor 10 and N sense power supply line 3 receive the ground voltage GND. The quantity of charges stored in decoupling capacitor 10 is zero since the potential difference between both the electrode nodes is zero.

Figure 4:
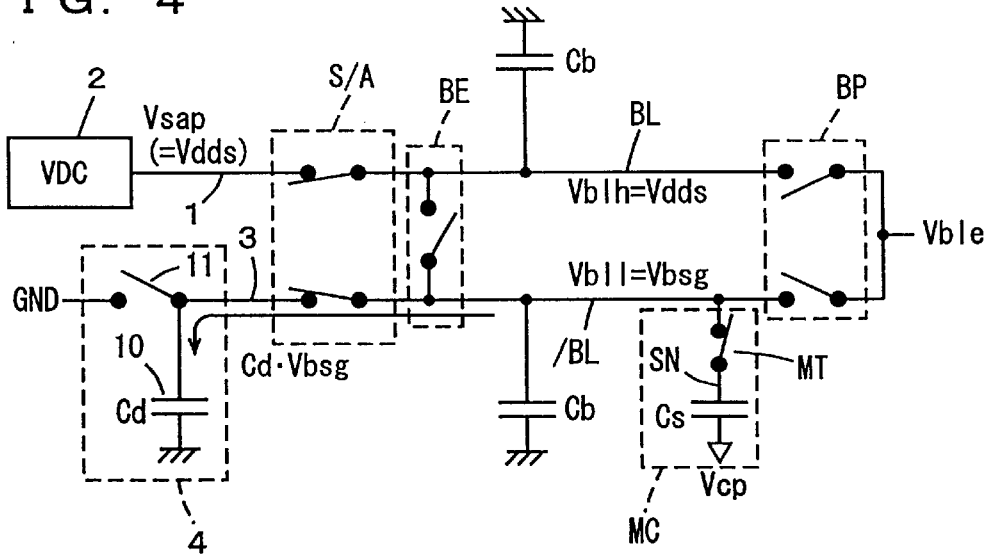
FIG. 4 conceptually illustrates a state of the semiconductor memory device according to the first embodiment of the present invention in completion of a sensing operation.

FIG. 4 conceptually illustrates states of the circuits and voltage distribution in completion of the sensing operation. In the sensing operation, switching transistor 11 is first rendered conductive in N sense power supply circuit 4 while the activation transistors are rendered conductive in sense amplifier circuit S/A, and the sense power supply lines 1 and 3 are coupled to bit lines BL and /BL through sense amplifier circuit S/A. FIG. 4 shows connection between the sense power supply lines 1 and 3 and the bit lines BL and /BL formed when low-level data is read on bit line /BL while bit line BL is driven to a high level. Bit line equalize circuit BE and bit line precharge circuit BP are inactive. In completion of the sensing operation, therefore, bit line BL has a voltage Vblh equal to P sense power supply voltage Vdds while a voltage Vbll of bit line /BL reaches the level of a boosted source ground voltage Vbsg. The voltage Vbll of bit line /BL is generated by redistribution of charges among memory cell capacitor Cs, bit line load capacitances Cb and decoupling capacitor 10. Assuming that Cd represents the capacitance value of decoupling capacitor 10, the following equation is obtained from the principle of conservation of charge:

$$Cb \cdot Vble + Cd \cdot 0 + Cs \cdot Vbsg0 = (Cb + Cd + Cs) \cdot Vbsg \qquad (3)$$

In general, the hold time for low-level data is extremely long (only the voltage level lowers in a leakage current to a substrate or the like, and the probability of causing such a soft error that the voltage level increases due to flow-in of positive charges is small in a stacked capacitor structure) and the low-level data hardly disappears in practice. In other words, Vbsg0=Vbsg. The intermediate voltage Vble is (Vdds+Vbsg)/2 and hence the above equation (3) is reduced to the following equation (3'):

$$Cb \cdot (Vdds - Vbsg)/2 = Cd \cdot Vbsg \qquad (3')$$

In the above equation (3'), the left side shows the change in amount of charges in bit line /BL, the right side shows the change in amount of charges in decoupling capacitor 10, and the level of the low-level voltage Vbsg is determined such that the quantities of change in these charges match with each other. In other words, the necessary capacitance value Cd of decoupling capacitor 10 can be uniquely determined when the level of the necessary voltage Vbsg is determined from data holdability of memory cell.

The above equation (3') has no term of memory capacitor Cs. In a block (block division is assumed) subjected to the sensing operation, therefore, the capacitance value Cd of decoupling capacitor 10 necessary as the whole is determined with no dependence on the number of memory cells in which low-level data are written. Assuming that N represents the number of pairs of bit lines in the memory block subjected to the sensing operation and Cdl represents the necessary capacitance value of decoupling capacitor 10, the following equation (4) is obtained from the above equation (3'):

$$N \cdot Cb \cdot (Vdds - Vbsg)/2 = Cdl \cdot Vbsg \qquad (4)$$

Figure 5A:
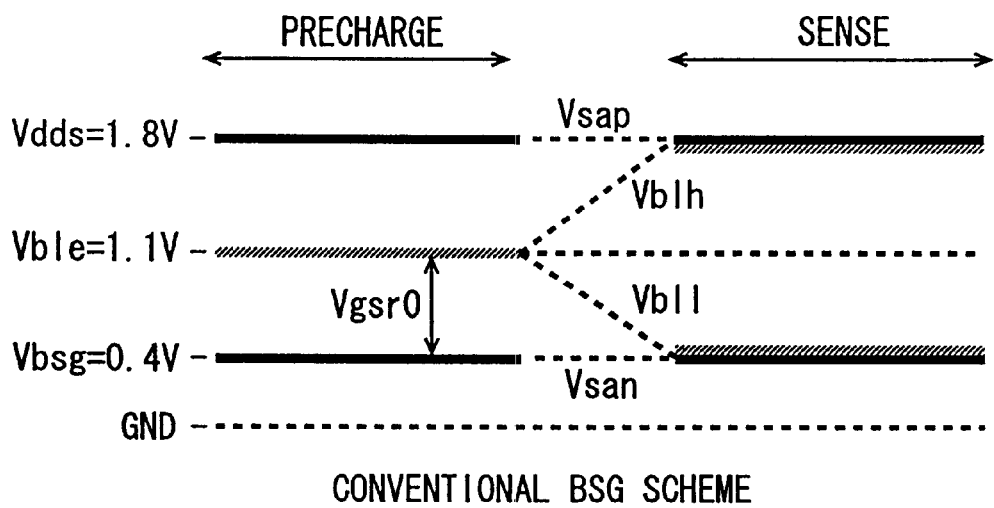
FIG. 5A illustrates changes of sense power supply voltages and bit line voltages in a conventional BSG scheme.
Figure 5B:
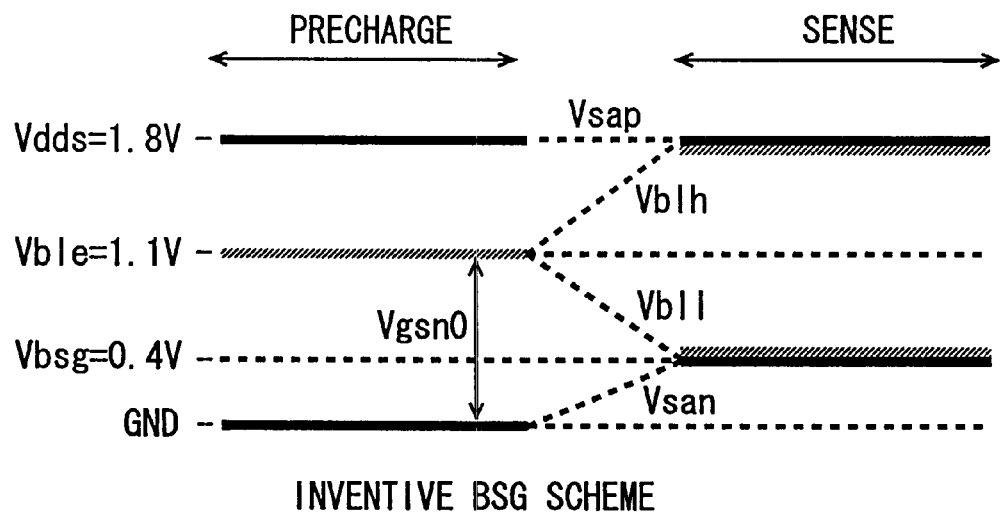
FIG. 5B illustrates changes of bit line voltages and sense power supply voltages according to the first embodiment.

FIG. 5A shows changes of the sense power supply voltages and the bit line voltages in the conventional BSG scheme, and FIG. 5B shows changes of the sense power supply voltages and the bit line voltages in the inventive BSG scheme. FIGS. 5A and 5B show potentials after stabilization in each operation, with no transient fluctuation of the sense power supply voltages immediately after starting the sensing operation, for example. P sense power supply voltage Vdds is set at 1.8 V, and the boosted source ground voltage Vbsg is set at 0.4 V, for example. In this case, the intermediate voltage Vble is 1.1 V.

In the conventional BSG scheme, N sense power supply voltage Vsan remains at the level of the boosted source ground voltage Vbsg, as shown in FIG. 5A. The voltage levels on the bit lines, which are equal to intermediate voltage Vble during the precharge period, change to the levels of P sense power supply voltage Vsap and the N sense power supply voltage Vsan respectively due to the sensing operation, and the bit line voltages are made definite at the high-level data voltage Vblh and the low-level data voltage Vbll. In this case, the read voltage from the memory cell is not clearly shown. The gate-to-source voltage Vgsn0 of the MOS transistors Q1 and Q2 included in N sense amplifier immediately after starting the sensing operation is about Vble−Vsan=0.7 V, i.e., at a level close to the threshold voltage of MOS transistors Q1 and Q2. If the circuit generating the boosted source ground voltage Vbsg has small current drivability in this case, therefore, it is conceivable that MOS transistors Q1 and Q2 are insufficiently turned on and the discharge operation cannot be performed at a high speed.

Figure 5C:
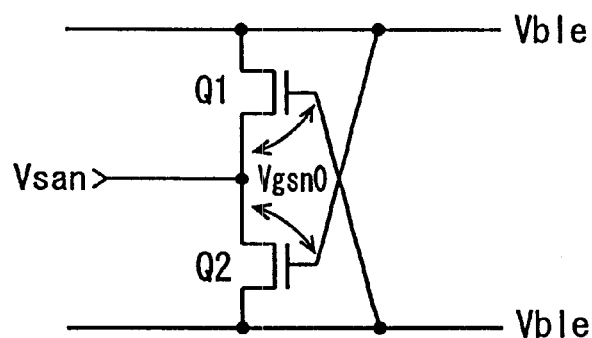
FIG. 5C illustrates a voltage applied to an N sense amplifier immediately after starting the sensing operation.

In the present invention, on the other hand, N sense power supply voltage Vsan is at the level of ground voltage GND in the precharge state, as shown in FIG. 5B. The bit line precharged to intermediate potential Vble is discharged by capacitance division and the voltage level thereof lowers to the level of the boosted source ground voltage Vbsg. When the sensing operation is started, the voltage difference between the voltage Vble of the bit lines and N sense power supply voltage Vsan is at the level of intermediate voltage Vble. As shown in FIG. 5C, therefore, the gate-to-source voltage Vgsn0 of MOS transistors Q1 and Q2 of N sense amplifier can be increased by a level corresponding to the boosted source ground voltage Vbsg as compared with the conventional BSG scheme. In this case, the voltage Vgsn0 reaches about 1.1 V upon starting of the sensing operation, and MOS transistors Q1 and Q2 of N sense amplifier can be reliably turned on for performing the sensing operation.

According to the present invention, further, N sense power supply voltage Vsan is held at the level of ground voltage GND during the precharge period. N sense power supply line need not be held at the level of the voltage Vbsg during the precharge period, and hence no circuit is required for generating the voltage Vbsg and current consumption can be reduced during the precharge period.

Immediately after starting the sensing operation, further, the n-channel transistors of the N sense amplifier operate in saturation regions. Assuming that a threshold voltage Vthn is 0.5 V, therefore, the ratio of increase of the drain current in the present invention can be derived as $(1.1-0.5)^2/(0.7-0.5)^2=9$ according to the square rule, which indicates that the current drivability of the N sense amplifier in the present invention is about nine times that of the conventional system immediately after starting the sensing operation, implementing a high-speed sensing operation. Thus, the sense time is reduced also in a normal mode operation, to implement high-speed access.

Intermediate voltage Vble for precharging the bit lines is generated on the basis of a reference voltage generated by resistance division of power supply voltage Vdds or the like.

According to the first embodiment of the present invention, as hereinabove described, the decoupling capacitor precharged to a prescribed voltage during the precharge period is connected to the N sense power supply line and the bit lines are discharged by charges stored in the decoupling capacitor, whereby the boosted source ground voltage Vbsg can be stably generated on the bit lines by redistribution of the charges while a high-speed sensing operation can be implemented.

[Second Embodiment]

Figure 6:
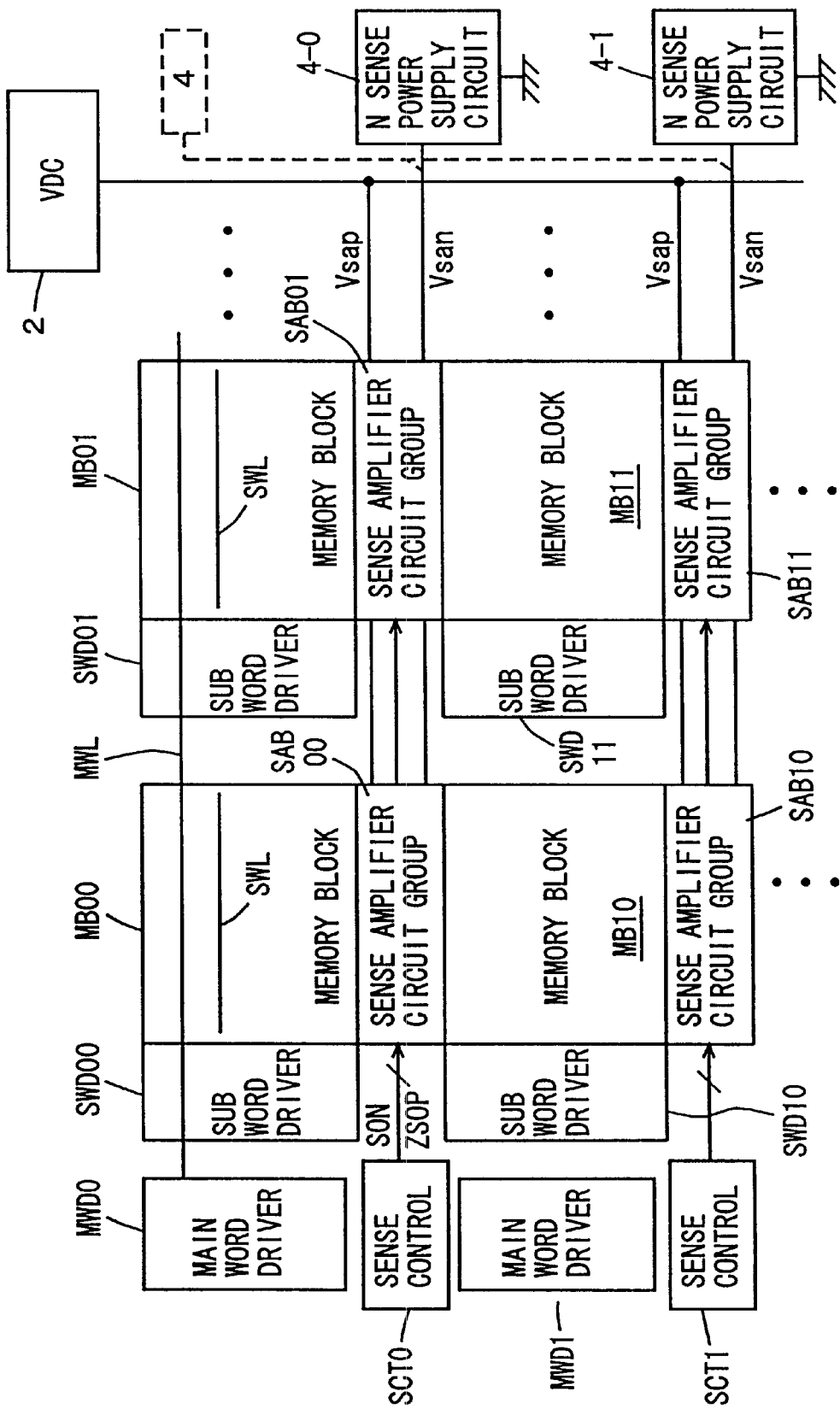
FIG. 6 schematically illustrates the structure of an array part of a semiconductor memory device according to a second embodiment of the present invention.

FIG. 6 schematically illustrates the structure of a main part of a semiconductor memory device according to a second embodiment of the present invention. Referring to FIG. 6, the semiconductor memory device includes a plurality of memory blocks MB00, MB01, MB10, MB11 . . . arranged in rows and columns. Each of memory blocks MB00, MB01, MB10, MB11 . . . has a plurality of memory cells arranged in rows and columns, and includes a sub word line SWL arranged in correspondence to each row of the memory cells. Sub word drivers SWD00 to SWD11 for driving the sub word lines to selected states are arranged for memory blocks MB00 to MB11, respectively. A main word line MWL is arranged in common for the sub word lines SWL of the memory blocks aligned with each other along the row direction. FIG. 6 representatively shows the main word line MWL provided for memory blocks MB00 and MB01. Memory blocks aligned with each other along the row direction form a single row block, and main word drivers MWD0, MWD1, . . . for driving a main word line to a selected state are arranged in correspondence to each row block.

Sense amplifier circuit groups SAB00 to SAB11 are arranged between the memory blocks adjacent along the column direction. Sense amplifier circuit groups SAB00 to SAB11 each include sense amplifier circuits arranged in correspondence to the respective columns of a corresponding memory block, and are shared by the memory blocks adjacent along the column direction.

A sense control circuit SCT0 is arranged for the sense amplifier circuit groups SAB00, SAB01, . . . aligned along the row direction, and a sense control circuit SCT1 is arranged for the sense amplifier circuit groups SAB10, SAB11, . . . aligned along the row direction. The sense amplifier circuits are arranged in units of row blocks, a main word line MWL is selected, a row block is brought into a selected state and the remaining memory blocks remain in non-selected states (precharge states).

An N sense power supply circuit 4-0 is arranged for sense amplifier circuit groups SAB00, SAB01, . . . aligned along the row direction, and an N sense power supply circuit 4-1 is provided for sense amplifier circuit groups SAB10, SAB11, . . . aligned along the row direction. Each of N sense power supply circuits 4-0 and 4-1 transmits an N sense power supply voltage Vsan to the sense amplifier circuit groups provided for the corresponding row block. An array voltage-down converter (VDC) 2 is provided in common for sense amplifier circuit groups SAB00, SAB01, SAB10, SAB11, . . . A power supply voltage Vdds from this array voltage-down converter (VDC) is supplied in common to sense amplifier circuit groups SAB00, SAB01, SAB10, SAB11, . . . as a P sense power supply voltage Vsap.

Referring to FIG. 6, a N sense power supply circuit 4 may be provided in common for memory blocks MB00 to MB11 (a plurality of row blocks) along the broken lines similarly to voltage-down converter VDC, and a decoupling capacitor may be connected to a common N sense ground line. A selected sense amplifier circuit group can utilize a decoupling capacitor having a large capacitance value. The common N sense ground line is arranged in common for all row blocks, and only the selected sense amplifier circuit group consumes the voltage on the common sense ground line.

Each of N sense power supply circuits 4-0 and 4-1, . . . is simply required to drive the sense amplifier circuit groups provided for the corresponding row block. Therefore, the capacitance value of the decoupling capacitor thereof is determined by the total capacitance value of bit line loads included in the corresponding row block. The most basic condition required for the arrangement of decoupling capacitor 10 is that interconnection line impedance between a sense amplifier circuit S/A and the decoupling capacitor is low. When sense amplifier circuit S/A and decoupling capacitor 10 are coupled through a low impedance, charges are efficiently transferred between a bit line load capacitance Cb and decoupling capacitor 10, and a boosted source ground voltage Vbsg can be stably generated at a high speed, for increasing the speed of a sensing operation. In the second embodiment of the present invention, the decoupling capacitor is dispersively arranged in the vicinity of the sense amplifier circuit groups in the corresponding row block for reducing the impedance between the bit line load capacitance and the decoupling capacitor.

FIG. 7A illustrates the structure of a unit capacitor 10a employed as the decoupling capacitor in the second embodiment of the present invention. Unit capacitor 10a is formed by an n-channel MOS transistor receiving a ground voltage GND at a source, a drain and a back gate (substrate region) while receiving the sense power supply voltage Vsan at a gate. In other words, an NMOS transistor implementing a large capacitance value with a small area is utilized as unit capacitor 10a. The gate of NMOS capacitor 10a is connected to an N sense power supply line. MOS transistor 10a has a low threshold voltage, is preferably a depletion MOS transistor, and enters a sufficiently ON state even if the gate voltage Vsan is low.

FIG. 7B schematically illustrates arrangement of decoupling capacitors. In the structure shown in FIG. 7B, unit capacitors 10a are dispersively arranged in a region CDL between an N sense amplifier arrangement region SAN and a P sense amplifier arrangement region SAP included in a sense amplifier circuit group adjacent to a memory block MB. A sub word driver SWD is arranged in correspondence to the memory block MB, and FIG. 7B shows arrangement region SWDN for an n-channel MOS transistor included in the sub word driver as the representative of sub word driver arrangement regions.

The sub word driver region SWDN is a P well region, and an n-channel MOS transistor formed on this region SWDN is coupled to have a source node 15 and back gate (substrate region) 16 thereof receiving the ground voltage GND, as shown in FIG. 7C.

P sense amplifier arrangement region SAP is an N well region, and a P sense activation transistor formed on this region is coupled to receive at a back gate 16 and a source node 15 thereof a P sense power supply voltage Vsap, as shown in FIG. 7D. N sense amplifier arrangement region SAN is a P well or substrate region, and a source node 15 and a back gate 16 of a sense amplifier activation transistor formed on this region receive an N sense power supply voltage Vsan, as shown in FIG. 7E.

Each unit capacitor arranged on the P-type substrate region between the regions SAP and SAN has a back gate 16 coupled to source and drain nodes 15 thereof for receiving the ground voltage GND supplied to the sub word driver and a gate 17 receiving the N sense power supply voltage Vsan. The unit capacitor forming a decoupling capacitor is arranged adjacent to sense amplifier arrangement region SAN, and hence the distance between the decoupling capacitor and a bit line load through sense amplifier circuit S/A is so reduced that the decoupling capacitor and the bit line can be coupled through low impedance.

Figure 8A:
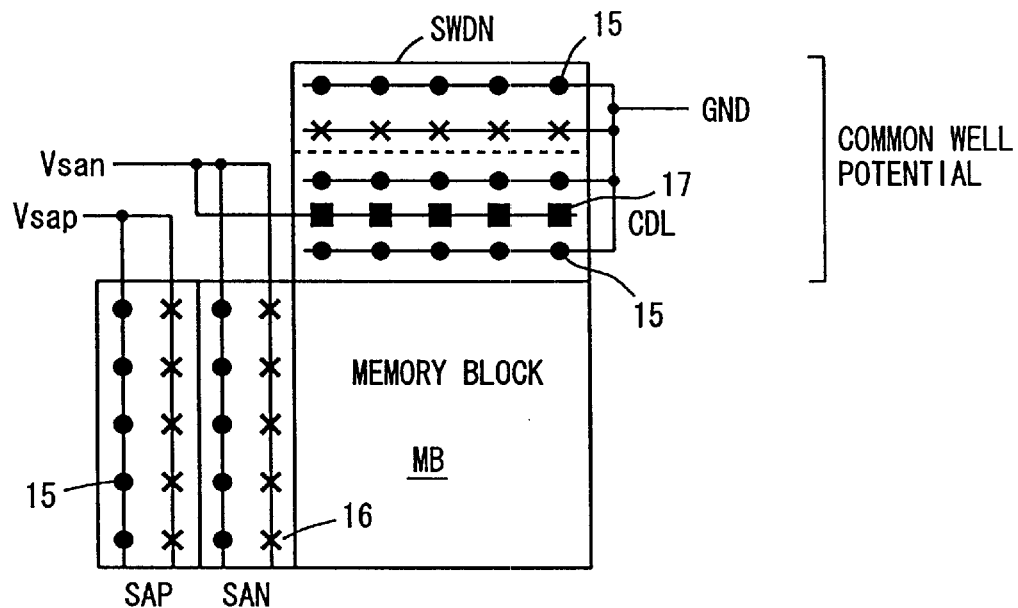
FIG. 8A illustrates the structure of a modification of the second embodiment of the present invention.

FIG. 8A illustrates another arrangement of unit capacitors. In the arrangement shown in FIG. 8A, a unit capacitor arrangement region CDL is provided between a sub word driver arrangement region SWDN and a memory block MB. A substrate region of memory block MB is a P-type substrate region. The region SWDN where n-channel MOS transistors of sub word drivers are arranged is also a P well or substrate region. The region CDL for arranging the unit capacitors is formed between the P-type regions of a P well or a substrate so that P well potentials of the region SWDN and the unit capacitor arrangement region CDL are common and a ground voltage GND is applied to sources/drains of NMOS capacitors provided in the arrangement region CDL. N sense power supply voltage Vsan is supplied to gates of the NMOS capacitors provided in the arrangement region CDL.

Figure 8B:
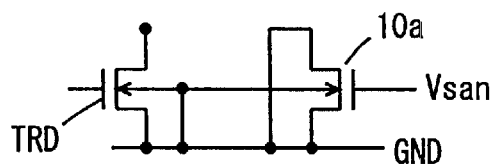
FIG. 8B illustrates connection of a sub word line driver and a capacitive element shown in FIG. 8A.

As shown in FIG. 8B, therefore, an n-channel MOS transistor TRD included in each sub word driver arranged in the region SWDN is coupled to receive at a back gate and a source thereof the ground voltage GND, while each NMOS transistor arranged in the region CDL is also so coupled to receive at a drain and a source thereof the same ground voltage GND and to receive at a gate thereof the N sense power supply voltage Vsan. Back gates of unit capacitor 10a and drive transistor TRD are present on the same P well or substrate region, and receive the same bias voltage.

The level of the voltage Vbsg is slightly higher than that of the ground voltage, and a gate capacitance of a depletion type n-channel MOS transistor can be utilized for making the unit capacitor 10a function as a capacitor. With the regions CDL and SWDN being a common P well region and with ground voltage GND being common, noise immunity can be improved as described later in detail. In the structure shown in FIG. 8A, no contact is required for supplying the ground voltage to the back gates in the region CDL, the area required for a substrate contact region is reduced, and area increase due to the arrangement of the decoupling capacitors can be reduced.

In practice, the arrangement shown in FIG. 7B or FIG. 8A or a combination thereof is utilized according to the relation between the performance of the decoupling capacitor and the layout area.

According to the second embodiment of the present invention, as hereinabove described, the decoupling capacitive elements are dispersively arranged adjacent to the sense amplifier arrangement region or the sub word driver arrangement region so that charges precharged in the decoupling capacitor can be efficiently transferred and redistributed at a high speed and the refresh characteristics can be improved without exerting a bad influence on a sensing operation.

[Third Embodiment]

Figure 9:
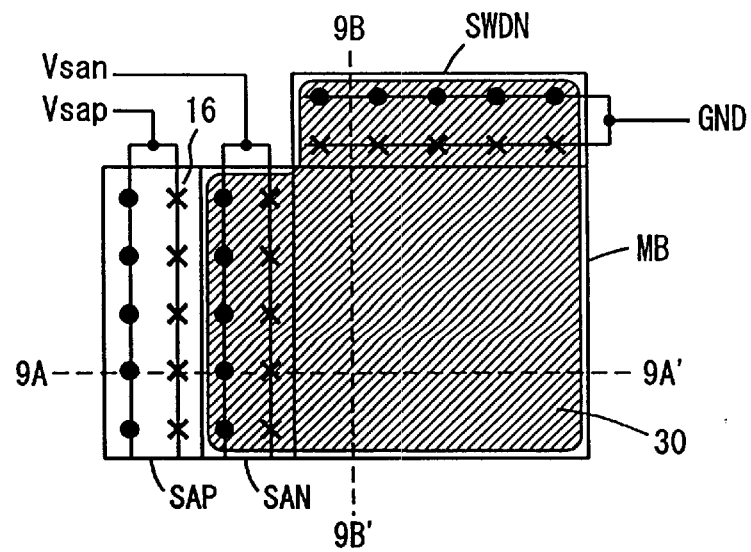
FIG. 9 schematically illustrates the structure of a main part of a semiconductor memory device according to a third embodiment of the present invention.

FIG. 9 illustrates the structure of a main part of a semiconductor memory device according to a third embodiment of the present invention. In the structure shown in FIG. 9, a memory block MB, an N sense amplifier arrangement region SAN and a region SWDN for arranging NMOS drivers of sub word drivers are formed in a P well. A bottom N well 30 is formed extending along a lower portion of the P well. A P-type substrate is arranged under the bottom N well 30. Junction capacitance formed between the P well and the P-type semiconductor substrate provided above and under the bottom N well 30 respectively are utilized as the decoupling capacitor. Therefore, for arranging the decoupling capacitor in an array, no region dedicated to the decoupling capacitors need be provided, and area increase can be suppressed. The bottom N well 30 is provided for each memory block MB, and is separated from a bottom N well for an adjacent memory block. If another component is formed in a region between the memory blocks and the bottom N well is made to extend over the memory array, it may be difficult to arrange the component such as a control circuit.

Figure 10:
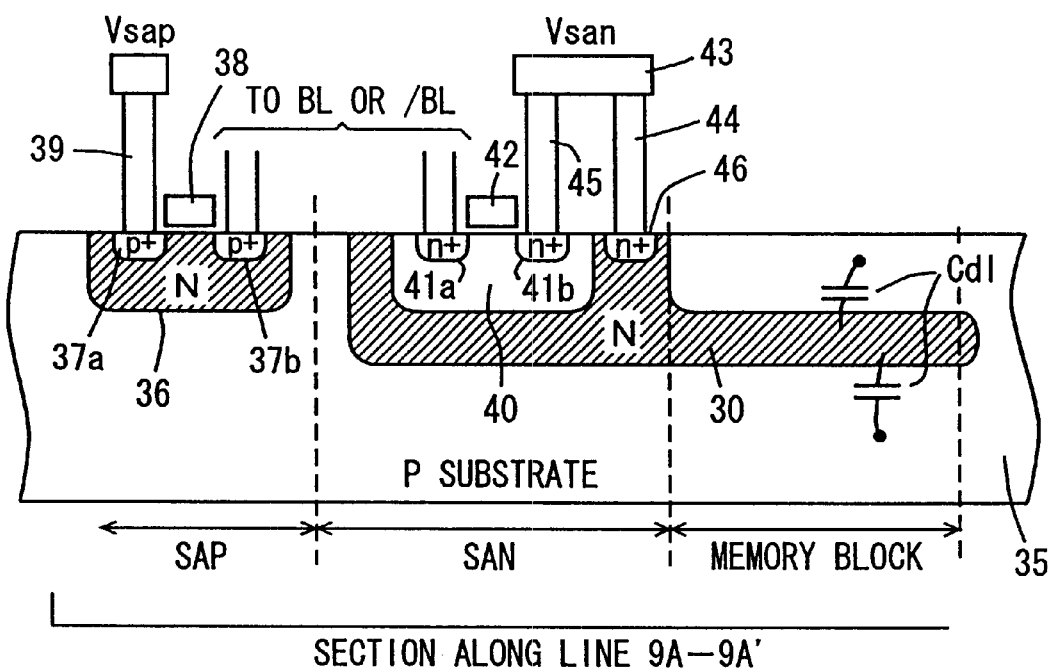
FIG. 10 schematically illustrates a sectional structure taken along the broken line 9A–9A' in FIG. 9.

FIG. 10 schematically illustrates a sectional structure taken along the broken line 9A–9A' in FIG. 9. A P substrate 35 is provided in common for a sense amplifier arrangement region SAP, the sense amplifier arrangement region SAN and the memory block MB. P substrate 35 may be a well region or an epitaxial layer.

In P sense amplifier arrangement region SAP, an N well 36 is formed on the surface of P substrate 35. High-concentration P-type impurity regions 37a and 37b are formed on the surface of N well 36, and a gate electrode layer 38 is formed on a channel region between the impurity regions 37a and 37b. Impurity region 37a receives a P sense power supply voltage Vsap through a conductive layer 39. Impurity region 37b is coupled to a bit line BL or /BL through a P sense transistor (not shown). Although FIG. 10 shows only a P sense amplifier activation transistor and does not show P sense amplifiers in P sense amplifier arrangement region SAP, MOS transistors forming the P sense amplifiers are arranged in N well 36.

In N sense amplifier arrangement region SAN, high-concentration N-type impurity regions 41a and 41b are formed on a P well 40. A gate electrode layer 42 is arranged on a channel region between the impurity regions 41a and 41b. A bottom N well 30 is arranged enclosing the P well 40 while extending over the lower portion of the entire memory cell arrangement region in the memory block region. Bottom N well 30 isolates the P well of N sense amplifier arrangement region SAN from the P-type substrate for the memory cell arrangement region of memory block MB.

Impurity region 41b receives an N sense power supply voltage Vsan through a conductive layer 45, and the bottom N well 30 receives the N sense power supply voltage Vsan supplied through a conductive layer (sense power supply line) 43 through a high-concentration N-type impurity region 46 formed on its surface and a conductive layer 44. A junction capacitance between bottom N well 30 and P substrate 35 is utilized as a decoupling capacitor Cdl, and that between the bottom N well 30 and the P well 40 is also utilized as a decoupling capacitor Cdl. Memory block MB has a relatively wide area, and the bottom N well 30 can implement a junction capacitance having a large capacitance value.

The bottom N well 30 merely extends in a memory block, and is terminated on an end portion of the memory block. In P well 40, impurity region 41a is coupled to a bit line BL or /BL through an N sense amplifier transistor (not shown). The impurity regions 41a and 41b and the gate electrode layer 42 form an N sense amplifier activation transistor.

N well 36 receives the P sense power supply voltage Vsap and the P well 40 receives the N sense power supply voltage Vsan, although not clearly shown in FIG. 10. This is clearly understood from the structure of back gate contact holes 16 shown in FIG. 9 supplied with the corresponding sense power supply voltage Vsan/Vsap.

Figure 11:
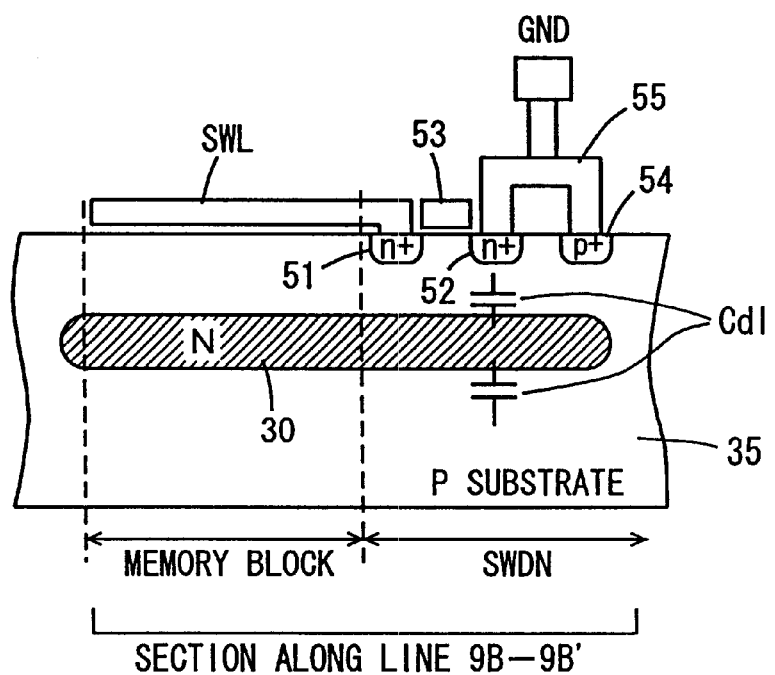
FIG. 11 schematically illustrates a sectional structure taken along the broken line 9B–9B' in FIG. 9.

FIG. 11 schematically illustrates a sectional structure taken along the broken line 9B–9B' in FIG. 9. As shown in FIG. 11, the bottom N well 30 extends along a row direction as a buried layer, and is terminated on an end portion of the memory block and an end portion of the sub word driver arrangement region. P substrate 35 for the memory block and n-channel MOS transistor arrangement region SWDN for the sub word drivers continuously extend. High-concentration N-type impurity regions 51 and 52 and a high-concentration P-type impurity region 54 are formed on the surface of sub word driver arrangement region SWDN. A gate electrode layer 53 is formed on a channel region between the impurity regions 51 and 52. Impurity region 51 is connected to a sub word line SWL extending in the row direction, and the impurity regions 52 and 54 each receive a ground voltage GND through a conductive layer 55. A sub word driver drives a sub word line SWL to a selected state in accordance with a signal on a main word line (not shown in FIG. 11). FIG. 11 shows only an n-channel MOS transistor for maintaining the sub word line SWL at a non-selected state, and does not show the structure of a part driving the sub word line SWL to a selected state, which is appropriately arranged depending on the structure of the sub word driver employed in practice.

In the structure shown in FIG. 11, P substrate 35 is fixed to ground voltage GND. Therefore, the bottom N well 30 receives the N sense power supply voltage Vsan through impurity region 46 shown in FIG. 10, and hence a junction capacitance is formed between the bottom N well 30 and P substrate 35 and can be utilized as the decoupling capacitor Cdl. The junction capacitance can be formed over a wide area for implementing decoupling capacitor having a sufficient capacitance value without providing a specific decoupling capacitor arrangement region by burying the bottom N well 30 in P substrate for the memory block, the N sense amplifier arrangement region and the n-channel MOS transistor arrangement region for the sub word drivers.

Impurity region 54 is so provided as to fix the P substrate 35 to the same ground voltage as that for the sub word driver. A ground voltage GND transmitted on conductive layer 55 is transmitted to a non-selected sub word line SWL. In the prior art, ground voltage GND supplied to the sub word driver and that for the circuit generating the boosted source ground voltage Vbsg are of different systems. In such a conventional BSG scheme, the ground voltage GND supplied to a sub word driver and the ground voltage for generating the boosted source ground voltage Vbsg cause noises independently of each other. Assuming that the ground voltage GND supplied to the sub word drivers causes a noise while the potential of a corresponding bit line BL (or /BL) corresponding to an access transistor connected to a non-selected sub word line SWL is stable, therefore, the gate-to-source voltage Vgs of the access transistor fluctuates and the bit line leakage current Ilb increases from the previous equation (2) particularly when a noise of a positive voltage is caused in the non-selected sub word line SWL, to result in such a possibility that the data holding characteristics of a memory cell is deteriorated and the level of boosted source ground voltage Vbsg fluctuates due to a leakage current from the memory cell.

According to the third embodiment of the present invention, however, the ground voltage GND for the sub word line drivers and the N sense power supply voltage are capacitively coupled through a part (at least ½) of the decoupling capacitor Cdl formed on the upper surface of the bottom N well 30. When N sense power supply voltage Vsan is equal to the prescribed voltage Vbsg in a sensing operation, a noise caused in ground voltage GND supplied to the sub word line drivers is transmitted in the same phase to N sense power supply voltage Vsan (=Vbsg) by the capacitive coupling. Therefore, the voltages of the gate and source of the access transistor of a non-selected memory cell fluctuate in phase with each other, and hence fluctuation of the gate-to-source voltage Vgs can be suppressed as compared with the prior art, for suppressing increase of the bit line leakage current Ilb caused by the noise of ground voltage GND for the sub word drivers.

According to the third embodiment of the present invention, as hereinabove described, noise immunity of the gate-to-source voltage of the access transistor against the ground voltage can be improved without increasing the layout area by utilizing the junction capacitances of the bottom N well formed on the lower portion of the memory block as the decoupling capacitors.

[Fourth Embodiment]

Figure 12:
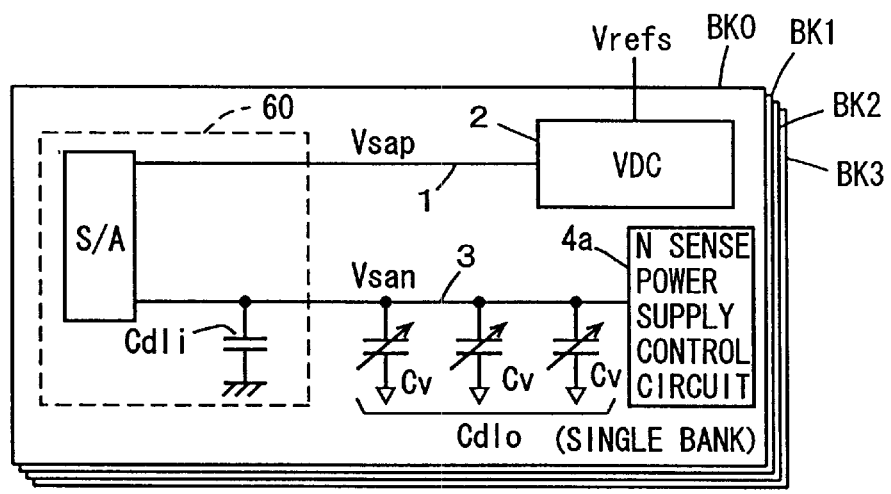
FIG. 12 schematically illustrates the structure of a main part of a semiconductor memory device according to a fourth embodiment of the present invention.

FIG. 12 schematically illustrates the structure of a main part of a semiconductor memory device according to a fourth embodiment of the present invention. The semiconductor memory device shown in FIG. 12 includes four banks BK0 to BK3. Banks BK0 to BK3 can be driven to active states (word line selected states) independently of each other. Therefore, an array voltage-down converter 2 and an N sense power supply control circuit 4a are provided for each bank. A memory array 60 includes memory cells arranged in rows and columns and memory blocks similar to those shown in FIG. 6. The array voltage-down converter (VDC) 2 transmits a P sense power supply voltage Vsap to memory array 60 through a P sense power supply line 1, while an N sense power supply voltage Vsan is transmitted to memory array 60 through an N sense power supply line 3. N sense power supply control circuit 4a includes a decoupling capacitive element Cdli formed in memory array 60 and a decoupling capacitive element Cdlo including a plurality of variable capacitive elements Cv formed outside memory array 60. N sense power supply control circuit 4a controls connection/disconnection of N sense power supply line 3 to/from a ground voltage.

As shown in FIG. 12, the decoupling capacitive elements are formed inside and outside the memory array 60 as the decoupling capacitive elements Cdli and Cdlo respectively, for preventing the layout of a sense amplifier circuit group and a sub word driver from being restricted due to the arrangement of the decoupling capacitor. The length of N sense amplifier power supply line 3 reaching a sense amplifier circuit S/A can be reduced, increase of line impedance can be suppressed and efficient charge transfer can be implemented by arranging the decoupling capacitive element Cdlo immediately outside memory array 60. If the in-array decoupling capacitor has an insufficient capacitance value, the out-of-array capacitive element can add a necessary capacitance value.

According to the fourth embodiment of the present invention, as hereinabove described, the decoupling capacitive elements are dispersively arranged inside and outside the memory array, whereby the layout of the sense amplifier circuit group and the sub word driver can be prevented from being suffered from bad influence exerted by the arrangement of the decoupling capacitor. Further, the capacitance value of the decoupling capacitive element Cdlo arranged outside memory array 60 can be readily trimmed by laser blowing, for example, without exerting a bad influence on the components in the memory array 60.

In the structure according to the fourth embodiment, the out-of-array capacitive element Cdlo may be distributedly arranged outside each row block in the structure shown in FIG. 6.

[Fifth Embodiment]

Figure 13:
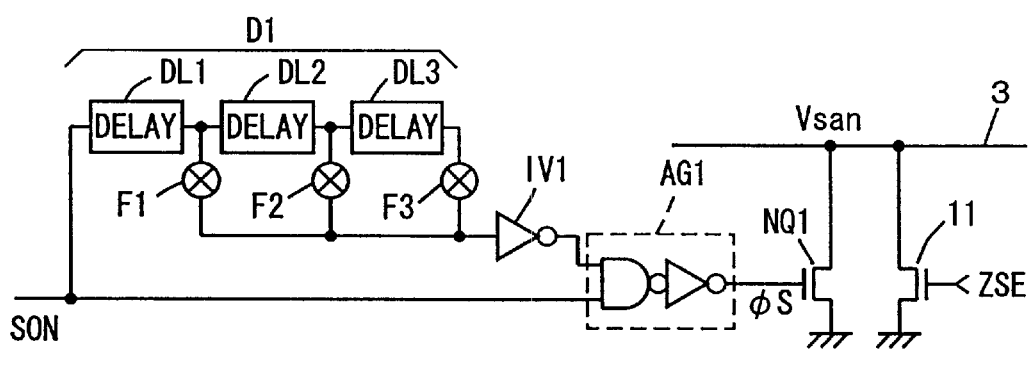
FIG. 13 schematically illustrates the structure of a main part of a semiconductor memory device according to a fifth embodiment of the present invention.

FIG. 13 illustrates the structure of an N sense power supply control circuit 4a. Referring to FIG. 13, N sense power supply control circuit 4a includes a floating prevention circuit connecting an N sense power supply line 3 to a ground node for a prescribed period in response to activation of a sense amplifier activation signal SON, in addition to an n-channel MOS transistor 11 rendered conductive in response to inactivation of a sense activation signal ZSE.

The floating prevention circuit includes cascaded delay circuits DL1 to DL3 delaying the sense amplifier activation signal SON by prescribed times respectively, fuse elements F1 to F3 provided at outputs of delay circuits DL1 to DL3 for transmitting output signals from the corresponding delay circuits when rendered conductive, an inverter circuit IV1 receiving the signal from any of fuse elements F1 to F3, an AND circuit AG1 receiving an output signal of inverter circuit IV1 and sense amplifier activation signal SON, and an n-channel MOS transistor NQ1 rendered conductive when an output signal of AND circuit AG1 is high, for connecting the N sense power supply line 3 to a ground node. AND circuit AG1 is formed by a NAND gate and an inverter.

Figure 14:
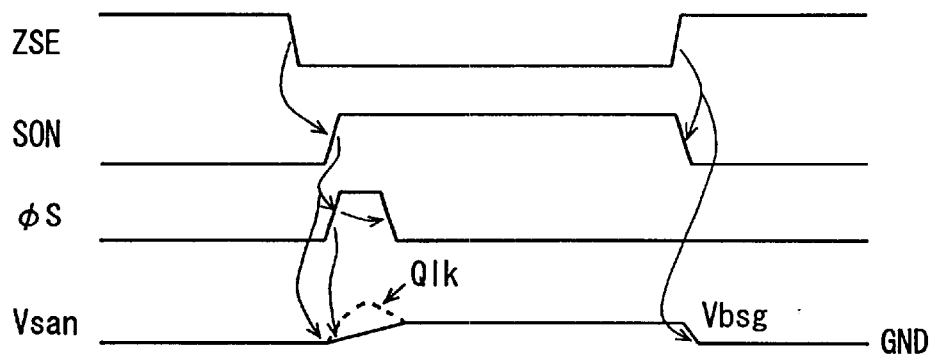
FIG. 14 is a signal waveform diagram representing an operation of a circuit shown in FIG. 13.

Fuse elements F1 to F3 are selectively blown of in a laser trimming step carried out in a final step of a wafer process, so that only one of fuse elements F1–F3 is rendered conductive. An operation of N sense power supply control circuit 4a shown in FIG. 13 will now be described with reference to FIG. 14.

In a precharge period, both sense activation signals ZSE and SON are inactive, and MOS transistor 11 is conductive and MOS transistor NQ1 is non-conductive. In this state, an N sense power supply voltage Vsan on N sense power supply line 3 is held at the level of ground voltage GND.

When an active cycle is started for performing memory selection, sense activation signal ZSE is activated and MOS transistor 11 is rendered non-conductive. In accordance with the activation of sense activation signal ZSE, sense amplifier activation signal SON is driven to a high-level active state. In response to this activation of sense amplifier activation signal SON, a signal φS from AND circuit AG1 goes high for a prescribed period, and MOS transistor NQ1 is rendered conductive to connect the N sense power supply line 3 to ground node. A sensing operation is performed in the active state of the sense amplifier activation signal SON. At this time, a P sense amplifier operates in accordance with sense amplifier activation signal ZSOP. During this period, therefore, not only charges from a bit line load Cb but also a through current from the P sense amplifier is supplied to N sense power supply line 3. The charge quantity Qlk of the through current from the P sense amplifier is discharged to the ground node by rendering the MOS transistor NQ1 conductive for a prescribed period, for preventing N sense power supply voltage Vsan from being driven to a level higher than a prescribed voltage Vbsg.

The capacitance value Cdl of decoupling capacitor 10 determined in accordance with the equation (4) derived in the first embodiment is an ideal value, and charges are redistributed between the decoupling capacitor and the bit line load. Therefore, it is the prerequisite for the equation (4) that all loads of the sensing operation employing the decoupling capacitor are capacitive. In a transient period between starting of the sensing operation and definition of high- and low-level data on a pair of bit lines, however, both MOS transistors of a P sense amplifier and an N sense amplifier of sense amplifier circuit S/A are rendered conductive and a through current flows from a P sense power supply voltage Vsap to N sense power supply voltage Vsan. P sense power supply voltage Vsap reaches the level of a power supply voltage Vdds from an array voltage-down converter. The charges Qlk of the through current are discharged to the ground node for absorbing the through current from the P sense amplifier by turning MOS transistor NQ1 on for a prescribed period.

A period for forming a leakage path for absorbing the through current on N sense power supply line 3 is determined by delay circuits DL1 to DL3. By selectively blowing off the fuse elements F1 to F3, the delay time is so adjusted that the period for rendering MOS transistor NQ1 conductive can be responsively adjusted.

In a test on a wafer level, the increased level of N sense power supply voltage Vsan on the N sense power supply line 3 is measured for determining the delay time of delay circuit DL1. Fuse elements F1 to F3 are programmed (blown off) in a laser trimming step for replacing a faulty memory cell and adjusting an internal potential in accordance with a test result after completion of the wafer process for a semiconductor memory device.

In the structure of the N sense power supply control circuit shown in FIG. 13, sense activation signal ZSE and sense amplifier activation signal SON are activated in units of row blocks, and are generated in combination with a row block specifying signal, a main sense activation signal and a main sense amplifier activation signal.

A signal ACT (or internal RAS) determining a memory cycle period may be employed as sense activation signal ZSE. Alternatively, an inverted signal of N sense amplifier activation signal SON may be employed as sense activation signal ZSE.

According to the fifth embodiment of the present invention, as hereinabove described, the N sense power supply line is forcibly connected to the ground node for a prescribed period upon starting of the sensing operation for forming a leakage path for the through current in the sense amplifier circuit, whereby the boosted source ground voltage Vbsg can be prevented from increasing so that the boosted source ground voltage Vbsg can be stably generated at a desired level.

[Sixth Embodiment]

Figure 15:
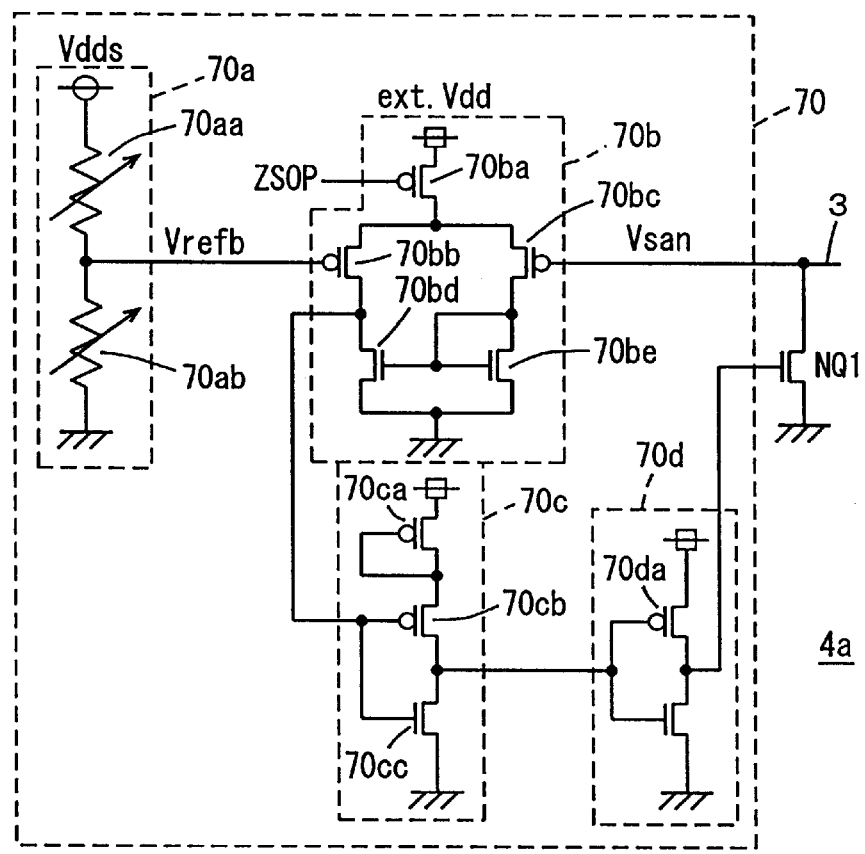
FIG. 15 schematically illustrates the structure of a main part of a semiconductor memory device according to a sixth embodiment of the present invention.

FIG. 15 illustrates the structure of an N sense power supply control circuit 4a according to a sixth embodiment of the present invention. FIG. 15 does not show MOS transistor 11 precharging an N sense power supply line 3 to the level of a ground voltage GND in response to a sense activation signal ZSE.

Referring to FIG. 15, N sense power supply control circuit 4a includes a comparator 70 comparing a reference voltage Vrefb and an N sense power supply voltage Vsan and outputting a signal in accordance with the result of comparison, and an n-channel MOS transistor NQ1 coupling the N sense power supply line 3 to a ground node in accordance with the output signal from comparator 70.

Comparator 70 includes a constant voltage generation circuit 70a generating the reference voltage Vrefb, a compare circuit 70b comparing the reference voltage Vrefb with N sense power supply voltage Vsan, an inverter circuit 70c amplitude-limiting and inverting an output signal of compare circuit 70b and outputting the inverted signal, and an inverter circuit 70d inverting the output signal of inverter circuit 70c and supplying the inverted signal to a gate of MOS transistor NQ1.

Constant voltage generation circuit 70a includes variable resistive elements 70aa and 70ab for resistance-dividing an array power supply voltage Vdds generated from an array voltage-down converter, for example. The resistance values of variable resistive elements 70aa and 70ab are trimmable and can be adjusted by a fuse element or a mask interconnection line, for example. The level of reference voltage Vrefb can be correctly set in each chip with no influence from fabrication parameters or the like by employing the variable resistive elements 70aa and 70ab.

Compare circuit 70b includes a p-channel MOS transistor 70ba receiving a P sense amplifier activation signal ZSOP in its gate, p-channel MOS transistors 70bb and 70bc forming a compare stage for comparing the reference voltage Vrefb and N sense power supply voltage Vsan, and n-channel MOS transistors 70*bd* and 70*be* forming a current mirror circuit connected between MOS transistors 70*bb* and 70*bc* and ground node. MOS transistor 70*be* has a gate and a drain interconnected with each other.

In compare circuit 70*b*, P sense amplifier activation signal ZSOP is utilized as an activation signal since a through current by a sense amplifier circuit on N sense power supply line 3 is generated in operation of a P sense amplifier.

Inverter circuit 70*c* includes a p-channel MOS transistor 70*ca* lowering an external power supply voltage ext. Vdd by the absolute value Vthp of a threshold voltage thereof, and a p-channel MOS transistor 70*cb* and an n-channel MOS transistor 70*cc* serially connected between a drain node of MOS transistor 70*ca* and ground node. The output signal of compare circuit 70*b* is supplied to gates of MOS transistors 70*cb* and 70*cc*.

Inverter circuit 70*d* is a general CMOS inverter circuit, and operates using the external power supply voltage ext. Vdd as one operating power supply voltage. By utilizing the p-channel MOS transistor 70*ca* in inverter circuit 70*c*, it is possible to compensate for reduction of a high level of an input signal to inverter 70*c* caused by transistor 70*ba* of compare circuit 70*b*, thereby correctly identifying the high/low level of the input signal, while the output high level of inverter circuit 70*c* becomes the reference voltage of (ext. Vdd–Vthp), and the p-channel MOS transistor of inverter circuit 70*d* can be substantially turned off (when the threshold voltages of MOS transistors 70*ca* and 70*da* are equal to each other). Thus, inverter circuit 70*d* can be immediately brought into an operating state for driving the MOS transistor NQ1 to a conductive state in operation of compare circuit 70. Operations are now briefly described.

In a precharge period, P sense amplifier activation signal ZSOP is high (at the level of external power supply voltage ext. Vdd), MOS transistor 70*ba* is non-conductive, and the output signal of compare circuit 70*b* is at the level of the ground voltage. In inverter circuit 70*c*, p-channel MOS transistor 70*cb* is responsively rendered conductive to output a signal at the level of ext. Vdd–Vthp supplied through p-channel MOS transistor 70*ca*.

In inverter circuit 70*d*, p-channel MOS transistor 70*da* substantially remains OFF, its output signal is at the level of the ground voltage, and MOS transistor NQ1 is non-conductive. While there is a possibility of flowing of a leakage current in inverter circuit 70*d* during the precharge period, this leakage current can be sufficiently reduced by reducing the current drivability of inverter circuit 70*d* (MOS transistor NQ1 is merely required to discharge leakage charges caused by a through current, and has current drivability sufficiently smaller than that of a current drive transistor included in a general array voltage-down converter).

When a sensing operation is started, P sense amplifier activation signal ZSOP is driven to an active state, p-channel MOS transistor 70*ba* is rendered conductive, and compare circuit 70*b* starts comparison. If N sense power supply voltage Vsan is higher than reference voltage Vrefb, the output signal (signal output from a connection node between MOS transistors 70*bb* and 70*bd*) of compare circuit 70*b* goes high, the output signal of inverter circuit 70*c* goes low, and inverter circuit 70*d* responsively amplifies the output signal of inverter circuit 70*c* and drives the MOS transistor NQ1 to a conductive state at a high speed. In inverter circuit 70*d*, p-channel MOS transistor 70*da* is substantially in a state between non-conductive and conductive states, and is rendered conductive at a high speed in accordance with the output signal of inverter circuit 70*c*, to drive the n-channel MOS transistor NQ1 to a conductive state. Thus, leakage charges Qlk caused by a through current in a P sense amplifier operation are discharged through MOS transistor NQ1.

When N sense power supply voltage Vsan falls below reference voltage Vrefb, the output signal of compare circuit 70*b* goes low, the output signal of the inverter 70*c* goes high, the output signal of inverter 70*d* responsively reaches the level of the ground voltage, and MOS transistor NQ1 is rendered non-conductive. By utilizing the two stages of inverters 70*c* and 70*d*, the output signal of compare circuit 70*b* changing in an analog manner can be digitally changed, MOS transistor NQ1 can be rendered conductive/non-conductive, and N sense power supply voltage Vsan on N sense power supply line 3 can be held at a prescribed level at a high speed through MOS transistor NQ1 having relatively small current drivability.

According to the sixth embodiment of the present invention, as hereinabove described, the N sense power supply voltage is compared with the reference voltage in the sensing operation so that the level of the N sense power supply voltage is adjusted in accordance with the result of the comparison. Even if the through current of the sense amplifier circuit flows into the N sense power supply line in the sensing operation, therefore, the N sense power supply voltage can be reliably held at a level determined by charge redistribution by capacitance division of the decoupling capacitor and bit line loads.

[Seventh Embodiment]

Figure 16:
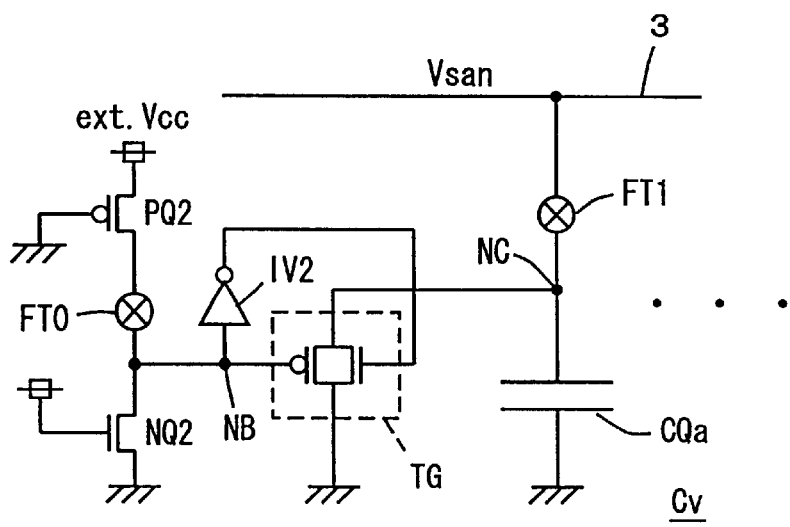
FIG. 16 schematically illustrates the structure of a main part of a semiconductor memory device according to a seventh embodiment of the present invention.

FIG. 16 illustrates the structure of an N sense power supply circuit according to a seventh embodiment of the present invention. The N sense power supply circuit shown in FIG. 16 includes an in-array decoupling capacitor Cdli and an out-of-array decoupling capacitor Cdlo for an N sense power supply line 3, similarly to the structure shown in FIG. 12. FIG. 16 shows the structure of a variable capacitive element Cv forming the out-of-array decoupling capacitor Cdlo. Referring to FIG. 16, variable capacitive element Cv includes a capacitive element CQa having a first electrode node coupled to N sense power supply line 3 through a fuse element FT1 and a second electrode node connected to a ground node, a p-channel MOS transistor PQ2 having a source connected to an external power supply node, a drain connected to a node NB through a fuse element FT0 and a gate connected to a ground node, an n-channel MOS transistor NQ2 connected between node NB and the ground node with a gate thereof connected to the external power supply node, an inverter IV2 inverting the signal potential on node NB, and a transmission gate TG selectively rendered conductive in accordance with the potential on node NB and the potential of an output signal of inverter IV2 for connecting a node NC to the ground node when rendered conductive. Node NC is connected to the first electrode node of capacitive element CQa.

The current drivability of MOS transistor PQ2 is set higher than that of MOS transistor NQ2. The MOS transistors PQ2 and NQ2 operate as resistive elements. When both fuse elements FT0 and FT1 are conductive, node NB is charged by MOS transistor PQ2 and goes high while the output signal of inverter IV2 goes low. In this state, transmission gate TG is non-conductive and capacitive element CQa is connected between N sense power supply line 3 and the ground node.

When both fuse elements FT0 and FT1, are blown off node NB reaches the ground voltage level through MOS transistor NQ2, while the output signal of inverter IV2 goes high and node NC is coupled to the ground node and disconnected from N sense power supply line 3. Thus, capacitive element CQa is disconnected from N sense power supply line 3 and does not function as a decoupling capacitor.

If temperature dependency of leakage charges Qlk from a sense amplifier circuit is substantially negligible, the capacitance value Vdl of a decoupling capacitor can be determined by adding the leakage charges Qlk to the above equation (4).

$$N \cdot Cb \cdot (Vdds - Vbsg)/2 + Qlk = Cdl \cdot Vbsg \quad (5)$$

In the above equation (5), temperature dependency of voltages Vdds and Vbsg is negligible, and that of a bit line load Cb is also negligible. If the temperature dependency of leakage charges Qlk is also negligible, a boosted source ground voltage Vbsg of a desired level can be generated through the decoupling capacitor by setting the capacitance value Cdl of the decoupling capacitor in accordance with the above equation (5).

However, the leakage charges Qlk are determined depending on each actual fabrication parameter of a semiconductor memory device. By utilizing the variable capacitive element Cv as shown in FIG. 16, therefore, the capacitance value of the decoupling capacitor is determined by selectively blowing off the fuse elements FT0 and FT1 in a laser trimming step of a wafer process. Fuse elements FT0 and FT1 are provided outside a memory array as shown in FIG. 12, and hence a programming of the capacitance value of the decoupling capacitor can be executed without exerting a bad influence on the structure in the memory array part.

Figure 17:
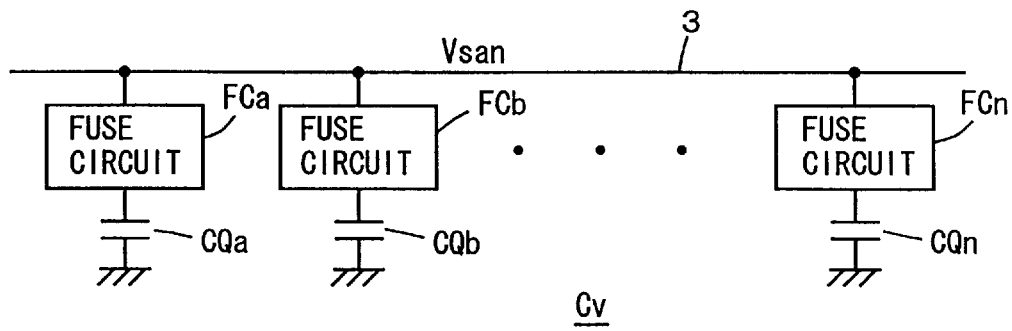
FIG. 17 schematically illustrates arrangement of a decoupling capacitor implemented by a variable capacitive element shown in FIG. 16.

FIG. 17 schematically illustrates the structure of the out-of-array variable decoupling capacitive element Cdlo shown in FIG. 12. FIG. 17 schematically illustrates one of variable capacitive elements Cv in the out-of-array decoupling capacitive element Cdlo. The variable capacitive element Cv includes a plurality of capacitive elements CQa to CQn and fuse circuits FCa to FCn provided in correspondence to capacitive elements CQa to CQn, respectively.

Each of fuse circuits FCa to FCn includes the fuse elements FT0 and FT1, transmission gate TG, MOS transistors PQ2 and NQ2 and inverter IV2 shown in FIG. 16. Fuse circuits FCa to FCn connect the corresponding capacitive elements CQa to CQn to N sense power supply line 3 in accordance with blow/non-blow of the fuse elements included therein. The capacitance value of variable capacitive element Cv connected to N sense power supply line 3 can be adjusted by fuse programming (selective blow-off the fuse elements) for fuse circuits FCa to FCn. Thus, even if leakage charges Qlk take place, the decoupling capacitor can absorb the leakage charges for preventing the level of the boosted source ground voltage Vbsg from exceeding the prescribed level, and a semiconductor memory device with improved refresh characteristics can be implemented in a simple circuit structure without exerting a bad influence on a sensing operation.

[Eighth Embodiment]

Figure 18:
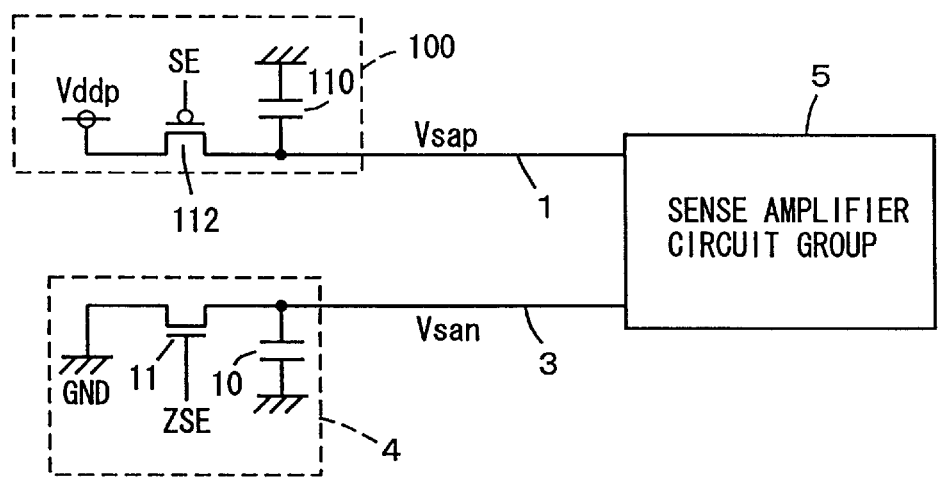
FIG. 18 schematically illustrates the structure of a main part of a semiconductor memory device according to an eighth embodiment of the present invention.

FIG. 18 illustrates the structure of a main part of a semiconductor memory device according to an eighth embodiment of the present invention. In the structure shown in FIG. 18, a P sense power supply circuit 100 for dynamically changing a P sense power supply voltage Vsap in response to an operation mode is provided for a P sense power supply line 1. For an N sense power supply line 3, an N sense power supply circuit 4 dynamically changing an N sense power supply voltage Vsan in response to the operation mode is provided similarly to the first to seventh embodiments.

P sense power supply circuit 100 includes a decoupling capacitor 110 coupled to P sense power supply line 1, and a p-channel MOS transistor 112 rendered conductive in inactivation of a sense activation signal SE for transmitting a power supply voltage Vddp to P sense power supply line 1. Decoupling capacitor 110 is connected between a ground node and P sense power supply line 1 and precharged to the level of power supply voltage Vddp during a precharge period. Power supply voltage Vddp is identical to a power supply voltage for a peripheral circuit, for example, and is 2.5 V, for example. The voltage of a bit line is set to the level of a general power supply voltage Vdds (e.g., 1.8 V) for a memory cell array by redistribution of charges stored in decoupling capacitor 110 and charges of a bit line load.

With P sense power supply circuit 100, decoupling capacitor 110 is charged during the precharge period while P sense power supply line 1 is disconnected from a power supply node in a sensing operation in response to the sense activation signal SE. P sense amplifiers are activated in response to activation of sense amplifier activation signal (ZSOP: not shown) responsive to inactivation of sense activation signal. Charges stored in decoupling capacitor 110 are merely consumed. In the sensing operation, therefore, no large current flows from the power supply node, a peak current in the sensing operation is reduced, and a power supply noise is responsively reduced. Once decoupling capacitor 110 is charged to the level of power supply voltage Vddp during the precharge period, no further current is consumed and hence decoupling capacitor 110 operates as a stabilizing capacitor, whereby P sense power supply voltage Vsap can be stably held at the level of power supply voltage Vddp.

Figure 19:
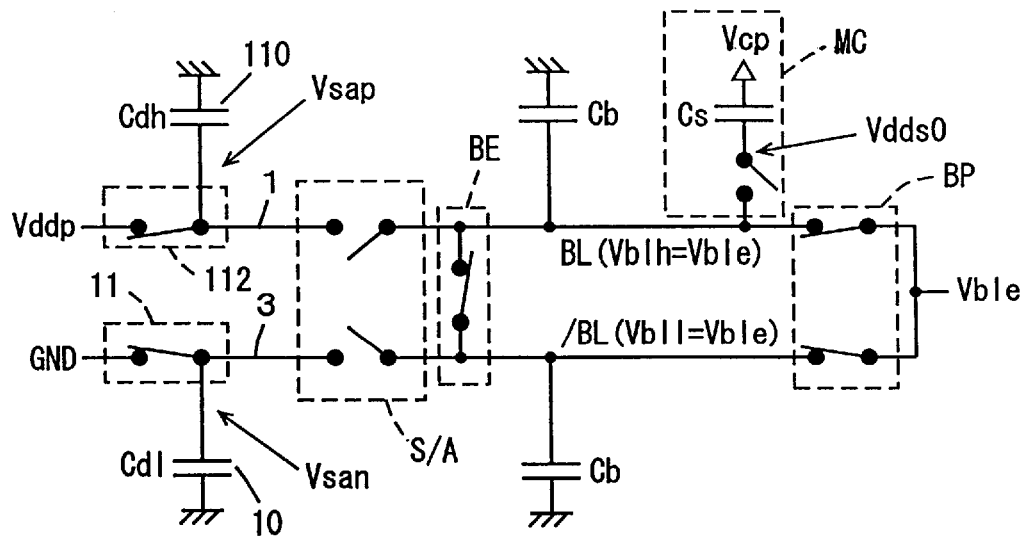
FIG. 19 conceptually illustrates a state of the structure shown in FIG. 18 in a precharge period.

FIG. 19 conceptually illustrates the state of circuitry in the precharge period in the structure shown in FIG. 18. In the structure shown in FIG. 19, parts corresponding to those in the structure shown in FIG. 3 are denoted by the same reference numerals. A memory cell MC is connected to a bit line BL and stores high-level data (voltage Vdds0). In the precharge period, bit line equalize circuit BE and bit line precharge circuit BP are conductive, and bit line BL and bit line /BL are precharged and equalized to an intermediate voltage Vble. In sense amplifier circuit S/A, the sense amplifier activation signal is non-conductive and sense power supply lines 1 and 3 are disconnected from bit lines BL and /BL.

In the sense power supply circuits, switching transistors 11 and 112 are conductive, and P sense power supply line 1 and decoupling capacitor 110 are charged to the level of power supply voltage Vddp. N sense power supply line 3 and decoupling capacitor 10 are precharged to the level of ground voltage GND.

Figure 20:
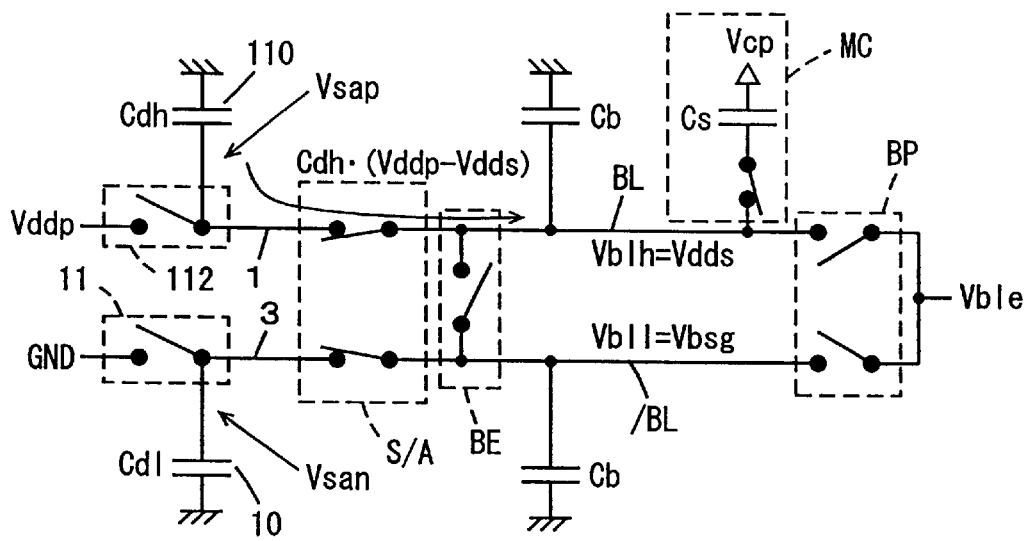
FIG. 20 conceptually illustrates a state of the structure shown in FIG. 18 in completion of a sensing operation.

FIG. 20 conceptually illustrates a state of the structure shown in FIG. 18 in completion of the sensing operation. In the sensing operation, bit line equalize circuit BE and bit line precharge circuit BP are first inactivated, then MOS transistors 11 and 112 are rendered conductive and then sense amplifier circuit S/A is activated. At this time, capacitor Cs of memory cell MC is connected to bit line BL, to transmit high-level data stored therein onto the bit line. Sense amplifier circuit S/A is activated, charges stored in decoupling capacitor 110 are transmitted to bit line BL, and the voltage of bit line BL increases to the Vdds level. On the other hand, the voltage of bit line /BL is reduced by decoupling capacitor 10 from the level of the intermediate voltage to the level of the boosted source ground voltage Vbsg. Assuming that Cd represents the capacitance value of decoupling capacitor 110 for each pair of bit lines, a charge redistribution process in bit line BL in the sensing operation is expressed as follows, similarly to the above equation (3):

$$Cb \cdot Vble + Cd \cdot Vddp + Cs \cdot Vdds0 = (Cb + Cd + Cs) \cdot Vdds \quad (6)$$

The hold time for the high-level data is shorter than that for low-level data, due to the presence of the aforementioned leakage path (bit line leakage current and substrate leakage current). Under a matured wafer process, however, substantially all memory cells have high-level data hold times sufficiently longer than a refresh interval Tref. In other words, it is assumable that deviation of the voltage level of the high-level data is small and Vdds0=Vdds at the refresh interval Tref. Hence, the above equation (6) is reduced to the following equation (6'):

$$Cb \cdot (Vdds - Vbsg)/2 = Cd \cdot (Vddp - Vdds) \quad (6')$$

where the intermediate voltage Vble is equal to (Vdds+Vbsg)/2.

In the above equation (6'), the left side shows charge change amount in bit line BL, and the light side shows charge change amount in decoupling capacitor 110.

The voltage Vdds is determined depending on various factors such as high-level data holdability, an operating margin of the sense amplifier circuit and reliability of an insulating film of memory cell capacitor Cs. The voltage Vdds exerts an influence on the operating margin of the sense amplifier circuit since a voltage ΔV appealing on bit line BL upon reading of the high-level data depends on the voltage Vdds. When the level of the voltage Vdds is determined, the capacitance value Cdh of decoupling capacitor 110 can be determined in accordance with the above equation (6'). Similarly to the first embodiment, the above equation (6') is not dependent on the capacitance value of memory cell capacitor Cs. Assuming that N represents the number of pairs of bit lines in a memory block subjected to the sensing operation, the capacitance value Cdh of the decoupling capacitor 110 necessary for the sensing operation is expressed as follows:

$$N \cdot Cb \cdot (Vdds - Vbsg)/2 = Cdh \cdot (Vddp - Vdds) \quad (7)$$

Hence, the relation between the capacitance values of decoupling capacitors to be connected with P sense power supply line 1 and N sense power supply line 3 respectively and the respective potentials can finally be expressed as follows:

$$Cdh \cdot (Vddp - Vdds) = N \cdot Cb \cdot (Vdds - Vbsg)/2 = Cdl \cdot Vbsg \quad (8)$$

Figure 21:
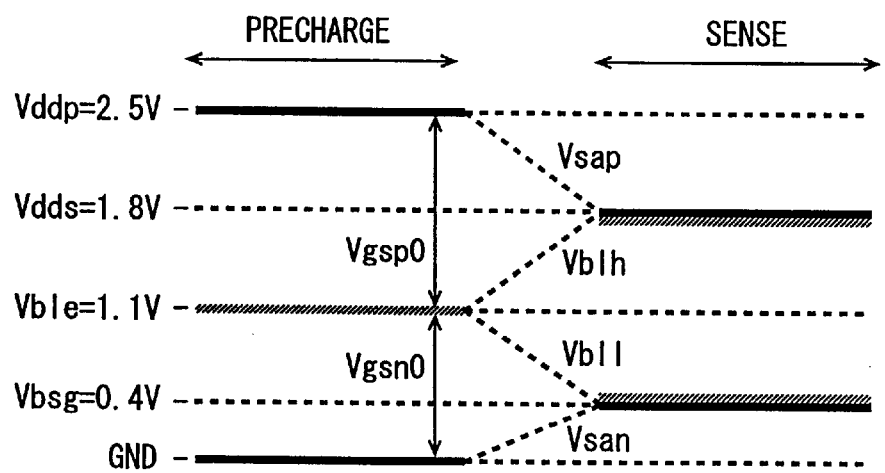
FIG. 21 schematically illustrates changes of potentials of bit lines and sense power supply lines in the structure shown in FIG. 18.

FIG. 21 schematically illustrates potential changes of the sense power supply lines and the bit lines in the eighth embodiment. Referring to FIG. 21, the sense power supply voltage Vddp is set to 2.5 V, the high-level voltage Vdds is set to 1.8 V, the intermediate voltage Vble is set to 1.1 V and the boosted source ground voltage Vbsg is set to 0.4 V, for example.

In a precharge state, P sense power supply voltage Vsap is at the level of power supply voltage Vddp, and N sense power supply voltage Vsan is at the level of ground voltage GND. The bit lines are precharged to the level of intermediate voltage Vble.

When the sensing operation is performed, the sense power supply voltage Vsap lowers to the high-level voltage Vdds while N sense power supply voltage Vsan increases to the level of the voltage Vbsg due to charge redistribution by the capacitors. As to the bit lines, the high-level voltage Vblh changes to the level of the voltage Vdds, while the low-level voltage Vbll changes to the level of the voltage Vbsg.

When a bit line does not receive the read data from a memory cell, but functions as a reference bit line providing a reference voltage for the sensing operation, the memory cell capacitor is not connected to the reference bit line. The reference bit line is at the intermediate voltage level before sensing operation, and the reference bit line finally reaches the Vdds or Vbsg level through the sensing operation. This is understood from the above equation (6') or (4') having no term of memory cell capacitor Cs. The sense start voltage of a bit line simply varies depending on whether to function as a reference bit line or as a bit line for receiving memory cell data.

When the sensing operation is started, the P sense power supply voltage Vsap is at the level of power supply voltage Vddp, while N sense power supply voltage Vsan is at the level of ground voltage GND.

Figure 22:
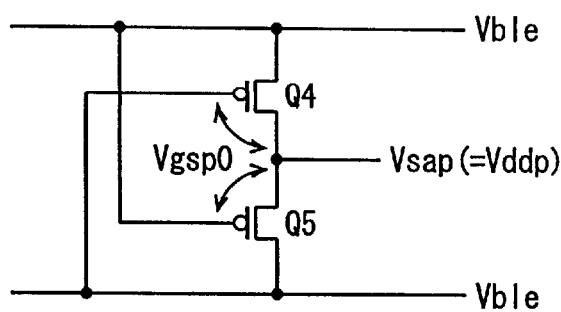
FIG. 22 schematically illustrates a voltage applied to a P sense amplifier transistor immediately after starting the sensing operation in the eighth embodiment of the present invention.

As shown in FIG. 22, a voltage Vgsp0 is applied between the gate and the source of each of MOS transistors Q4 and Q5 in P sense amplifier when the sensing operation is started. The voltage Vgsp0 is 1.4 V, as shown in FIG. 21. Therefore, the current drivability of the P sense amplifier can be increased as compared with the case of fixing the P sense power supply voltage Vsap to the voltage Vdds, and a high-speed sensing operation is implemented. When the absolute value Vthp of the threshold voltage of p-channel MOS transistors Q4 and Q5 shown in FIG. 22 is set to 0.5 V, for example, the drivability upon starting the sensing operation can be increased about 20 times.

Figure 23:
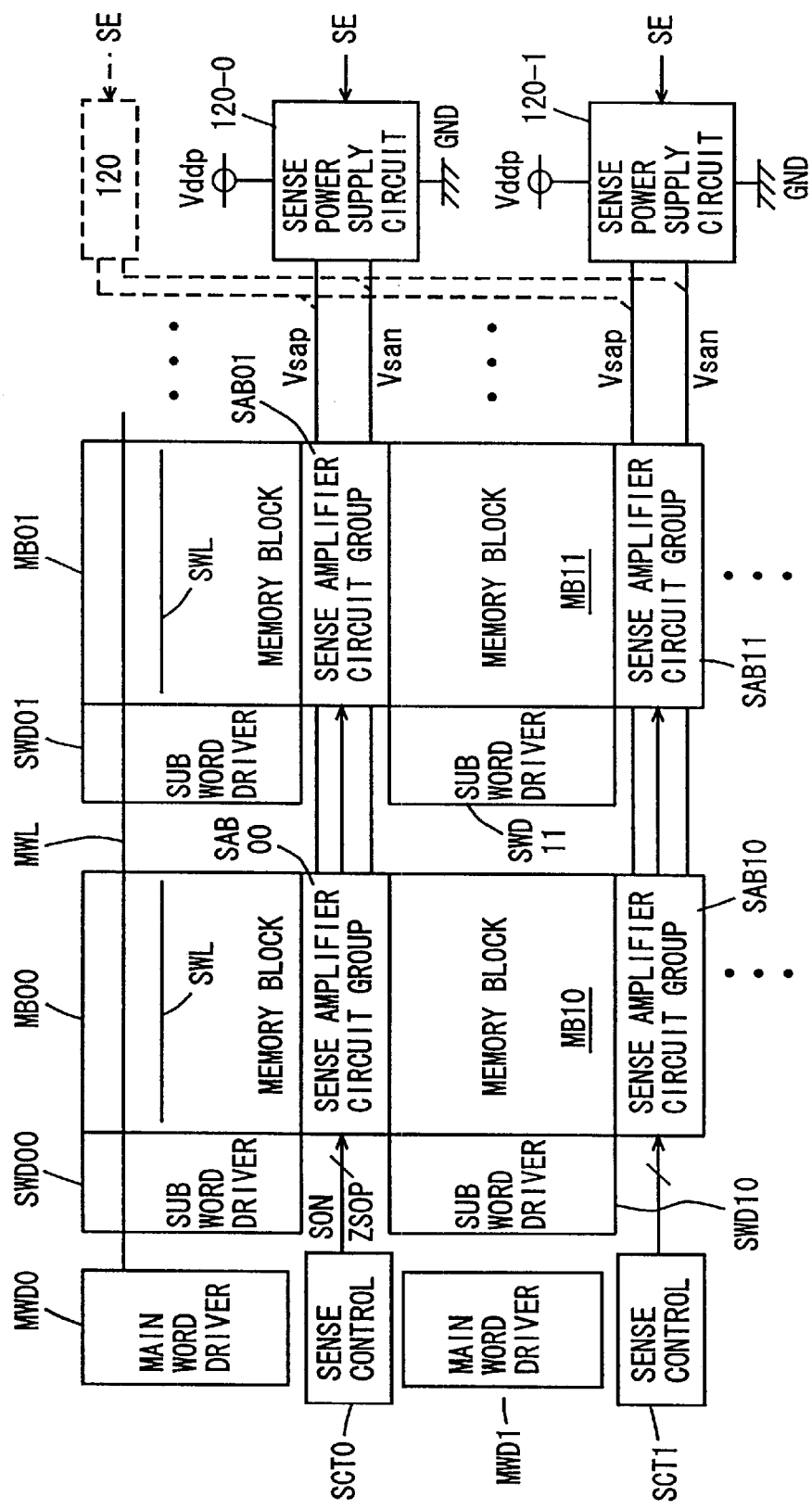
FIG. 23 schematically illustrates the structure of an array part of the semiconductor memory device according to the eighth embodiment of the present invention.

FIG. 23 illustrates the structure of a main part of the semiconductor memory device according to the eighth embodiment of the present invention. In the structure shown in FIG. 23, sense power supply circuits 120-0, 120-1, . . . are arranged in correspondence to sense amplifier circuit groups (sense amplifier bands) aligned along a row direction. The remaining structure is identical to that shown in FIG. 6, and hence corresponding parts are denoted by the same reference numerals and detailed description thereof is not repeated. Also in FIG. 23, a sense power supply circuit 120 may be provided in common for a plurality of row blocks as shown by broken lines, similarly to the structure shown in FIG. 6.

Sense power supply circuits 120-0, 120-1, . . . (120) each include both of a P sense power supply circuit 100 and an N sense power supply circuit 4. Sense power supply circuits 120-0, 120-1, . . . (120) are supplied with power supply voltage Vddp and ground voltage GND. Power supply voltage Vddp is generated by down-converting the external power supply voltage through an internal voltage-down converter (not shown). Sense power supply circuits 120-0, 120-1, . . . are activated in accordance with sense activation signal SE. Sense activation signal SE is driven to the active state when a row block in the row blocks is selected (when including selected memory cells). When the corresponding row blocks are all in non-selected states, sense activation signal SE remains inactive, and hence the corresponding sense power supply circuits 120-0, 120-1, . . . supply the power supply voltage Vddp and the ground voltage GND as sense power supply voltages, respectively. The sense activation signal SE may be activated/inactivated on a memory array basis or on a basis of an array block having a single word line selected therein. With the common sense power supply circuit 120, even if sense power supply voltages Vsap and Vsan to a non-selected sense amplifier circuit group fluctuate the corresponding sense activation signals ZSOP and SON are inactive to cause no problem in particular, and a selected sense amplifier circuit group performs a sensing operation by charges from the common decoupling capacitor.

Similarly to decoupling capacitor for N sense power supply voltage Vsan, decoupling capacitor for the P sense power supply voltage may be arranged in the sense power supply circuits 120-0, 120-1, . . . (120) by:

(1) arranging all decoupling capacitive elements in the array; or
(2) dispersively arranging the decoupling capacitive elements inside and outside the array. The decoupling capacitors Cdl and Cdh for the N sense power supply voltage and the P sense power supply voltage may be arranged in parallel in a region adjacent to a sense amplifier circuit group or a sub word driver as shown in FIGS. 8 and 9.

In implementing the decoupling capacitor 10 (Cdl) for N sense power supply voltage Vsan with MOS capacitors, however, depletion n-channel MOS transistors, for example, having a sufficiently small threshold voltage Vthn must be utilized, as described with reference to the second embodiment. In this case, a relatively large occupying area is required for implementing decoupling capacitors having a sufficient capacitance value, as described with reference to the conventional art. When only the decoupling capacitor for N sense power supply voltage is employed, the decoupling capacitor can be arranged in the memory array as described with reference to the second embodiment. When the decoupling capacitors for both P sense power supply voltage Vsap and N sense power supply voltage Vsan are utilized, however, the occupying area is so increased that it is difficult to arrange all MOS capacitors forming the decoupling capacitors in the array. When the common sense power supply circuit 120 is utilized, out-of-array capacitors are utilized for the common decoupling capacitors.

According to the eighth embodiment of the present invention, therefore, the decoupling capacitors for the P sense power supply voltage and the N sense power supply voltage are partially formed by junction capacitances.

Figure 24:
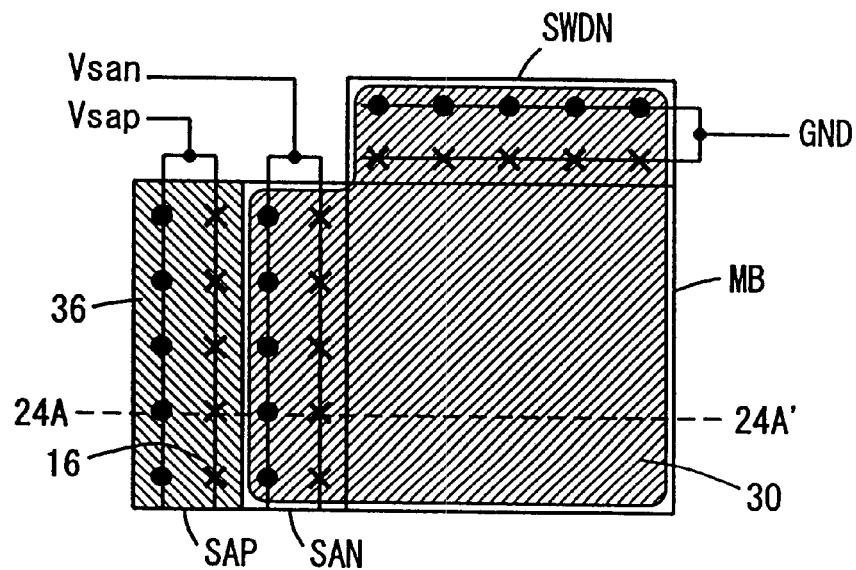
FIG. 24 schematically illustrates an arrangement of capacitive elements in the eighth embodiment of the present invention.

FIG. 24 schematically illustrates arrangement of the decoupling capacitors in the eighth embodiment of the present invention. Referring to FIG. 24, the decoupling capacitors for the N sense power supply voltage are formed by a bottom N well 30 formed in a memory block MB, an N sense amplifier arrangement region SAN and an n-channel MOS transistor arrangement region SWDN for sub word lines, similarly to the structure shown in FIG. 9.

The sense amplifier arrangement region SAP, has a substrate region formed by an N well 36, and a p-n junction capacitance between N well 36 and the underlying P-type substrate is utilized as the decoupling capacitor Cdh for the P sense power supply voltage.

Figure 25:
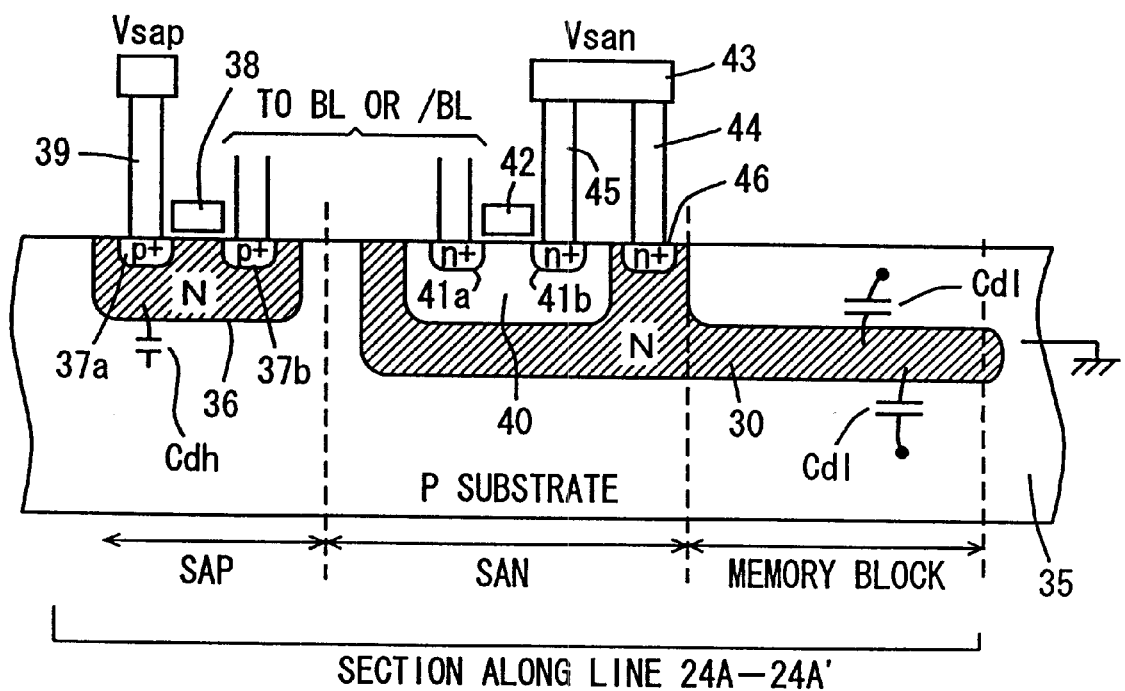
FIG. 25 schematically illustrates a sectional structure taken along the broken line 24A–24A' in FIG. 24.

FIG. 25 schematically illustrates a sectional structure taken along the broken line 24A–24A' in FIG. 24. The sectional structure shown in FIG. 25 is identical to that shown in FIG. 10, and corresponding parts are denoted by the same reference numerals.

As shown in FIG. 25, the bottom N well 30 is formed in a P substrate 35, and the p-n junctions between the bottom N well 30, and P substrate 35 and a P well 40 are utilized as the decoupling capacitor Cdl for the N sense power supply voltage.

In P sense amplifier arrangement region SAP, the p-n junction capacitance formed between N well 36 and P substrate 35 is utilized as the decoupling capacitor Cdh for the P sense power supply voltage. N well 36 is coupled to receive the P sense power supply voltage Vsap, as shown by contacts 16 appearing in FIG. 24. Therefore, N well 36 functions as an electrode of a decoupling capacitor for the P sense power supply voltage. P substrate 35 is biased to ground voltage GND, as shown in FIG. 11. Therefore, the p-n junction capacitance between N well 36 and P substrate 35 defines a capacitive element having an electrode node coupled to receive the P sense power supply voltage Vsap and another electrode node coupled to receive the ground voltage GND. Thus, the decoupling capacitor for the P sense power supply voltage can be implemented without employing any additional structure. A sectional structure in a direction perpendicular to broken line 24A–24A' is identical to that shown in FIG. 11.

Figure 26:
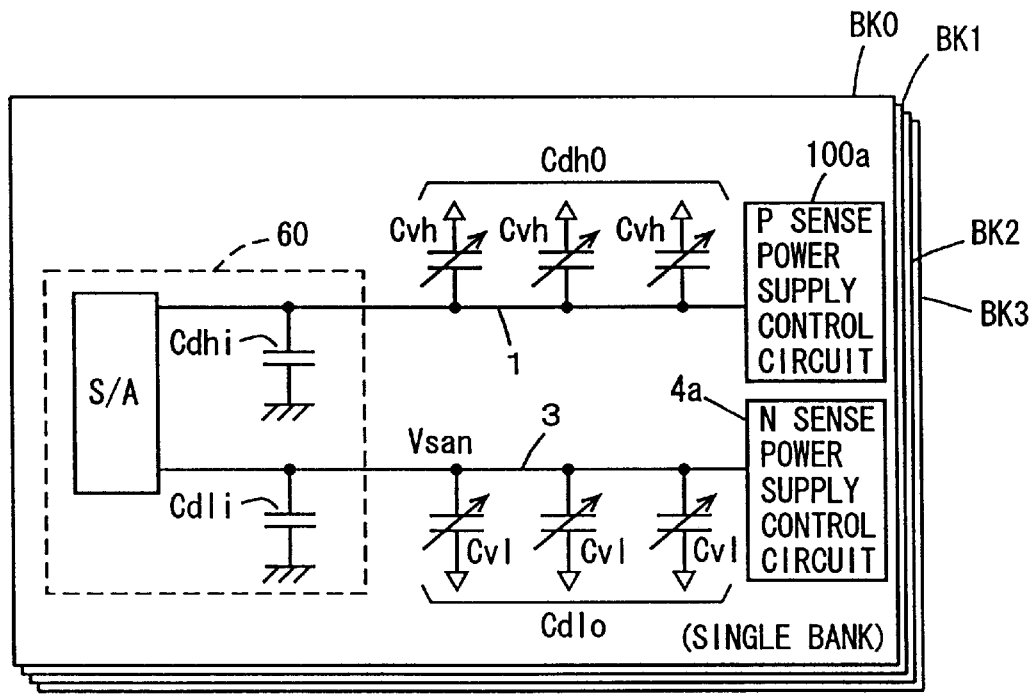
FIG. 26 schematically illustrates the structure of a sense power supply circuit in the eighth embodiment of the present invention.
Figure 27:
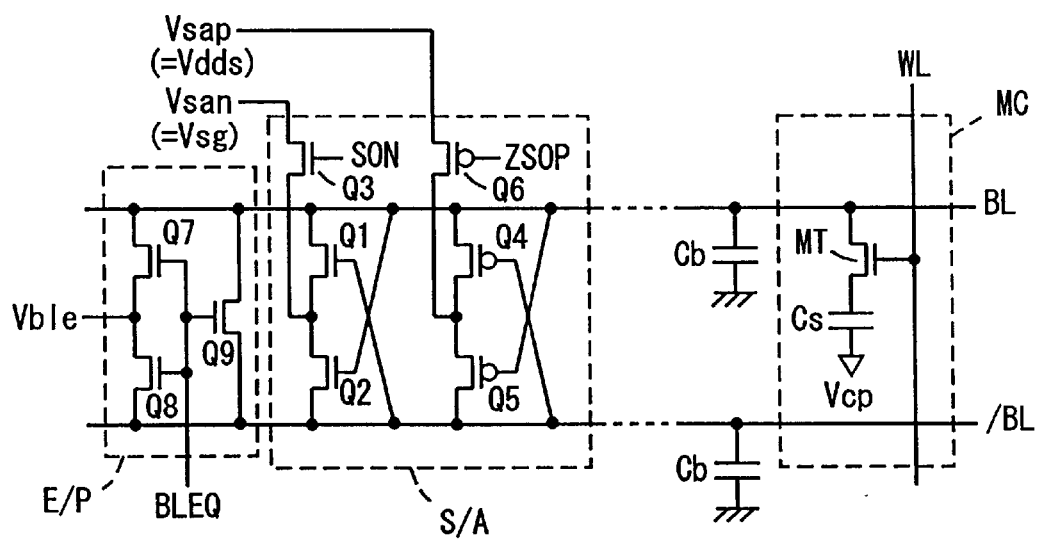
FIG. 27 illustrates the structure of an array part of a conventional semiconductor memory device.
Figure 28:
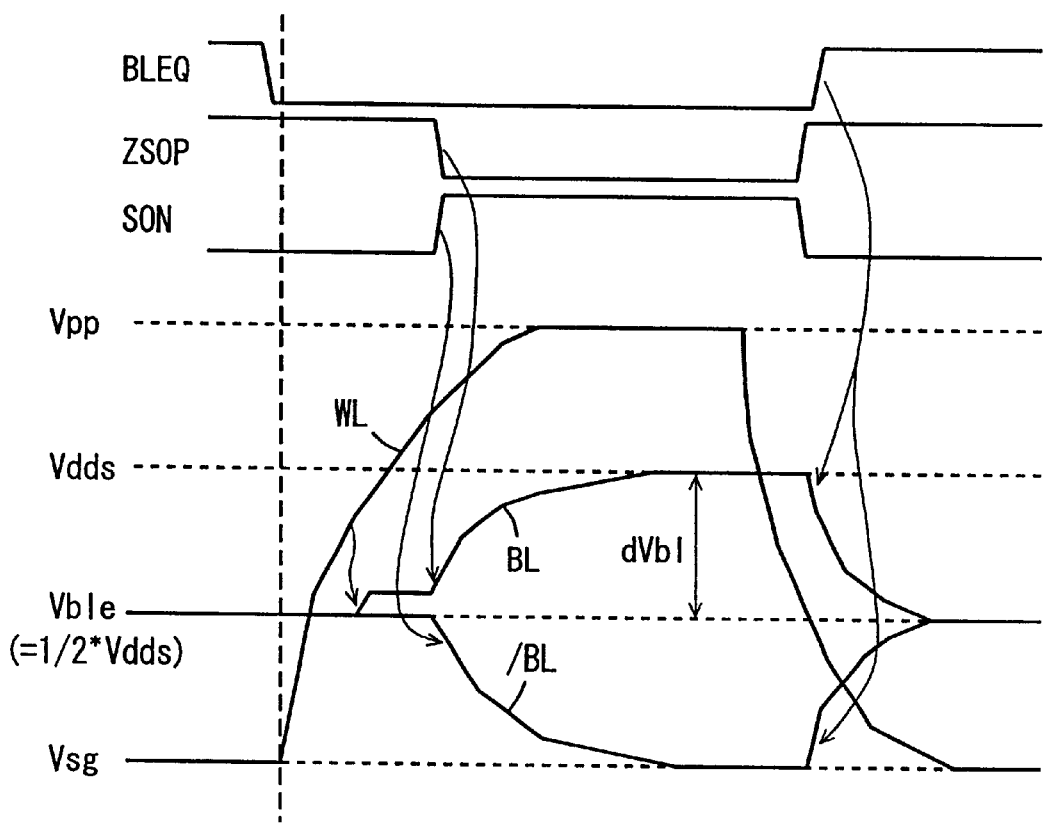
FIG. 28 is a signal waveform diagram representing operations of the structure shown in FIG. 27.

FIG. 26 illustrates the structure of a main part of the semiconductor memory device according to the eighth embodiment of the present invention. The semiconductor memory device shown in FIG. 26 includes four banks BK0 to BK3, similarly to the semiconductor memory device shown in FIG. 12. In each bank, a P sense power supply control circuit 100a is provided for a P sense power supply line 1 and an N sense power supply control circuit 4a is provided for an N sense power supply line 3. P sense power supply control circuit 100a includes a switching transistor connecting the P sense power supply line 1 to a power supply node supplying the power supply voltage Vddp in accordance with a sense activation signal. N sense power supply control circuit 4a similarly includes a switching transistor connecting the N sense power supply line 3 to a ground node in accordance with a sense activation signal. P sense power supply control circuit 100a may have a structure for compensating for reduction of a sense power supply line voltage caused by charges Qlk resulting from a through current, similarly to those in the fifth and sixth embodiments. Out-of-array capacitors Cdh0 and Cdl0 may be shared by row blocks in a bank as common decoupling capacitors.

P sense power supply line 1 and N sense power supply line 3 extend from power supply control circuits 100a and 4a toward sense amplifier circuits S/A provided in a memory array 60. In memory array 60, a capacitive element Cdhi is connected to P sense power supply line 1, and a capacitive element Cdli is provided for N sense power supply line 3. Capacitive elements Cdhi and Cdli are formed by p-n junction capacitances, as shown in FIG. 25.

Outside the memory array, a plurality of variable capacitive elements Cvl are connected in parallel with N sense power supply line 3, and a plurality of variable capacitive elements Cvh are connected in parallel with P sense power supply line 1. Variable capacitive elements Cvl form the out-of-array decoupling capacitive element Cdl0, and variable capacitive elements Cvh form the out-of-array decoupling capacitive element Cdh0. Variable capacitive elements Cvl and Cvh are similar in structure to those shown in FIGS. 16 and 17. Thus, decoupling capacitors for stably supplying the sense power supply voltages can be arranged without increasing the area occupied by the memory array. Out-of-array capacitive elements Cdh0 and Cdl0 are arranged in proximity to memory array 60, whereby the distances between sense power supply line 1 and 3 and out-of-array capacitive elements Cdh0 and Cdl0 are reduced, charges can be transferred through low impedance, and sense amplifiers can be driven at a high speed. Further, variable capacitive elements Cvh implement an effect similar to that of variable capacitive elements Cvl.

[Other Applications]

The present invention is applicable to any semiconductor memory device employing a sense amplifier circuit differentially amplifying potentials of a pair of bit lines.

Further, the present invention is applicable to both of a shared sense amplifier structure sharing a sense amplifier circuit between adjacent memory blocks and an alternately arranged shared sense amplifier structure of alternately arranging sense amplifiers on both sides of a memory block.

According to the present invention, as hereinabove described, the bit lines are charged and discharged through charges stored in the decoupling capacitor, whereby voltages of desired levels can be correctly generated on the bit lines by the capacitance value of the decoupling capacitor and the bit line load capacitance values. Further, a sense peak current in the sensing operation can be reduced. In addition, the boosted source ground voltage can be generated under a low power supply voltage in a memory of the BSG scheme.

The potential of the low-level bit line is rendered higher than the ground voltage, and hence a leakage current in a non-selected memory cell can be suppressed, and a semiconductor memory device having excellent refresh characteristics can be implemented.

The charging voltage for the decoupling capacitor are rendered lower than the level of low-level data stored in a memory cell and higher than the voltage of high-level data, whereby the sensing operation can be performed at a high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged aligned in at least one column;
   a pair of bit lines arranged corresponding to the column and connected with memory cells of the corresponding column;
   a first sense power source line;
   a first sense amplifier for differentially amplifying potentials of said pair of bit lines in accordance with a voltage on said first sense power source line when activated;
   a first capacitive element connected to said first sense power source line; and
   a control circuit for coupling said first sense power source line to a first power source in response to inactivation of a first sense activation signal instructing activation of said first sense amplifier and disconnecting said first power source and said first sense power source line in response to activation of said first sense activation signal.

2. The semiconductor memory device in accordance with claim 1, wherein said first power source supplies a voltage lower than a voltage of low-level data stored in a memory cell of the memory cells.

3. The semiconductor memory device in accordance with claim 1, wherein said first power source supplies a voltage higher than a voltage of high-level data stored in a memory cell of the memory cells.

4. The semiconductor memory device in accordance with claim 1, further comprising:
   a second sense power source line,
   a second sense amplifier for differentially amplifying potentials of said pair of bit lines complementarily to said first sense amplifier in accordance with a voltage on said second sense power source line when activated,
   a second capacitive element coupled with said second sense power source line, and
   a second control circuit for coupling said second sense power source line to a second power source in response to inactivation of a second sense activation signal instructing activation of said second sense amplifier and disconnecting said second sense power source line from said second power source in response to activation of said second sense amplifier signal.

5. The semiconductor memory device in accordance with claim 1, wherein said first capacitive element includes a junction capacitive element formed between a first conductivity type semiconductor substrate region and a second conductivity type impurity region formed on a surface of the semiconductor substrate region.

6. The semiconductor memory device in accordance with claim 1, wherein the memory cells are arranged in an array of rows and columns in a memory block, and
   said first capacitive element includes a junction capacitive element formed between a first conductivity type first semiconductor substrate region serving as a substrate for said memory cells of said memory block and a second conductivity type first impurity region formed under the first semiconductor substrate region.

7. The semiconductor memory device in accordance with claim 6, wherein the first impurity region is formed on a first conductivity type second semiconductor substrate region, extends in said memory block and so terminates on an end of said memory block that the second semiconductor substrate region is connected with the first semiconductor substrate region.

8. The semiconductor memory device in accordance with claim 5, wherein said first sense amplifier includes a transistor formed on a first conductivity type second impurity region formed on a surface of said second conductivity type impurity region.

9. The semiconductor memory device in accordance with claim 1, wherein the memory cells are arranged in a memory array in an array of rows and columns and said first sense amplifier is arranged in said memory array in correspondence to each of said columns,
   said first sense power source line includes:
      an in-array interconnection line part extending in said memory array, and
      an out-of-array interconnection line part extending outside said memory array, and
   said first capacitive element includes:
      a capacitor coupled with said in-array interconnection line part, and
      a capacitor coupled with said out-of-array interconnection line part.

10. The semiconductor memory device in accordance with claim 1, further comprising means coupled to said first sense power source line, for coupling said first sense power source line to said first power source for a prescribed period in response to inactivation of said first sense activation signal.

11. The semiconductor memory device in accordance with claim 1, wherein said first capacitive element includes a trimmable capacitive element having an adjustable capacitance value.

12. The semiconductor memory device in accordance with claim 1, wherein the memory cells are arranged in a plurality of columns,
   said first sense amplifier is arranged in correspondence to each of the columns,
   said first sense power source line is arranged in common for each said first sense amplifier, and
   said first capacitive element includes a plurality of capacitors dispersively arranged in a region adjacent to a region where said first sense amplifier is arranged and coupled with said first sense power source line.

13. The semiconductor memory device in accordance with claim 1, wherein the memory cells are arranged in rows and columns, said semiconductor memory device further includes:
a word line arranged in correspondence to each of the rows; and
a word line driver for driving a word line corresponding to an addressed row to a selected state, and
said first capacitive element includes a plurality of capacitors dispersively arranged in a region between a region where said word line driver is arranged and a region where said memory cells are arranged and coupled to said first sense power source line.

14. The semiconductor memory device in accordance with claim 13, wherein each of the capacitors comprises an insulated gate field effect transistor, and said word line driver includes an insulated gate field effect transistor, and the insulated gate field effect transistors of the capacitors and the word line driver are formed on a common substrate region.

15. The semiconductor memory device in accordance with claim 4, further comprising;

a second sense amplifier for differentially amplifying potentials of said pair of bit lines complementarily to said first sense amplifier, and
means for comparing a voltage of said first sense power source line with a reference voltage in response to activation of a second sense amplifier activation signal and causing a current flow between said first power source and said first sense power source line in accordance with a result of comparison.

16. The semiconductor memory device in accordance with claim 6, wherein the first impurity region is formed surrounding the first semiconductor substrate region and on a first conductivity type second semiconductor substrate region, and said first capacitive element further includes another junction capacitive element formed between the first impurity region and the second semiconductor substrate region.

17. The semiconductor memory device in accordance with claim 7, wherein said first capacitive element further includes another junction capacitive element formed between the first impurity region and the second substrate region.

18. The semiconductor memory device in accordance with claim 1, wherein the memory cells are divided into a plurality of banks driven into an active state independently of each other, and the first sense power source line, the first capacitive element and the control circuit in combination are provided for each of the banks.

19. The semiconductor memory device in accordance with claim 10, wherein said means couple said first sense power source line to said first power source in response to activation of a first sense amplifier activation signal activating said first sense amplifier.

* * * * *